US011419231B1

(12) United States Patent
Lancaster-Larocque et al.

(10) Patent No.: US 11,419,231 B1
(45) Date of Patent: Aug. 16, 2022

(54) FORMING GLASS COVERS FOR ELECTRONIC DEVICES

(71) Applicant: Apple Inc., Cupertino, CA (US)

(72) Inventors: Simon R. Lancaster-Larocque, San Jose, CA (US); Robert Y. Cao, San Francisco, CA (US); Dinesh C. Mathew, San Francisco, CA (US); A C Manjunath, Sunnyvale, CA (US); Christopher D. Jones, Los Altos, CA (US); Christopher D. Prest, San Francisco, CA (US); Ari P. Miller, San Francisco, CA (US); Karan Bir, Bangalore (IN); Genie Kim, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 561 days.

(21) Appl. No.: 15/886,203

(22) Filed: Feb. 1, 2018

Related U.S. Application Data

(63) Continuation of application No. 15/710,352, filed on Sep. 20, 2017, now abandoned.

(60) Provisional application No. 62/398,483, filed on Sep. 22, 2016.

(51) Int. Cl.
| | |
|---|---|
| *H05K 5/03* | (2006.01) |
| *H04M 1/02* | (2006.01) |
| *C03B 11/08* | (2006.01) |
| *G06F 1/16* | (2006.01) |
| *G06F 3/041* | (2006.01) |

(52) U.S. Cl.
CPC .............. *H05K 5/03* (2013.01); *C03B 11/08* (2013.01); *G06F 1/1626* (2013.01); *G06F 1/1643* (2013.01); *G06F 3/041* (2013.01); *H04M 1/0266* (2013.01)

(58) Field of Classification Search
None
See application file for complete search history.

(56) References Cited

U.S. PATENT DOCUMENTS

| | | |
|---|---|---|
| 2,795,084 A | 6/1957 | Littleton |
| 3,410,673 A | 11/1968 | Marusak |
| 3,433,611 A | 3/1969 | Kubican |
| 3,464,880 A | 9/1969 | Rinehart |
| 3,737,294 A | 6/1973 | Dumbaugh, Jr. et al. |

(Continued)

FOREIGN PATENT DOCUMENTS

| | | |
|---|---|---|
| CN | 103986803 | 8/2013 |
| CN | 104837781 | 8/2015 |

(Continued)

OTHER PUBLICATIONS

Aben et al., "A New Method for Tempering Stress Measurement in Glass Panels," Estonian Journal of Engineering, vol. 19, No. 4, pp. 292-297, 2013.

(Continued)

*Primary Examiner* — Xanthia C Cunningham
(74) *Attorney, Agent, or Firm* — Brownstein Hyatt Farber Schreck, LLP

(57) ABSTRACT

A cover for an electronic device includes a glass cover defining a substantially planar first surface, a substantially planar second surface opposite the first surface, an opening extending through the glass cover, and a raised wall surrounding the opening and defining a portion of an interior surface of the opening.

14 Claims, 29 Drawing Sheets

(56) References Cited

U.S. PATENT DOCUMENTS

| | | |
|---|---|---|
| 3,746,526 A | 7/1973 | Giffon |
| 3,899,315 A | 8/1975 | Siegmund |
| 4,054,895 A | 10/1977 | Ham et al. |
| 4,070,211 A | 1/1978 | Haran et al. |
| 4,209,229 A | 6/1980 | Rittler |
| 4,339,300 A | 7/1982 | Noble et al. |
| 4,735,917 A | 4/1988 | Flatley et al. |
| 4,849,299 A | 7/1989 | Loth et al. |
| 5,122,177 A | 6/1992 | Yoshizama et al. |
| 5,173,453 A | 12/1992 | Beall et al. |
| 5,273,553 A | 12/1993 | Hoshi et al. |
| 6,055,053 A | 4/2000 | Lesniak |
| 6,067,005 A * | 5/2000 | DeVolpi ............... G06F 3/0205 200/512 |
| 6,169,256 B1 * | 1/2001 | Hanahara ............ H01H 13/7006 200/341 |
| 6,406,769 B1 | 6/2002 | Delabre et al. |
| 6,928,224 B2 | 8/2005 | Beall et al. |
| 7,115,827 B2 * | 10/2006 | Tseng ..................... H01H 13/70 200/341 |
| 7,240,519 B2 | 7/2007 | Schwartz et al. |
| 7,459,199 B2 | 12/2008 | Skeen |
| 7,497,093 B2 | 3/2009 | Rosenflanz |
| 7,799,158 B2 | 9/2010 | Yokoyama et al. |
| 7,902,474 B2 * | 3/2011 | Mittleman ............. H01H 13/14 200/516 |
| 7,966,785 B2 | 6/2011 | Zadesky et al. |
| 8,003,217 B2 | 8/2011 | Rosenflanz |
| 8,092,737 B2 | 1/2012 | Chang et al. |
| 8,212,455 B2 | 7/2012 | Yura et al. |
| 8,277,704 B2 | 10/2012 | Matsushima et al. |
| 8,379,159 B2 | 2/2013 | Hsu |
| 8,665,160 B2 | 3/2014 | Uttermann et al. |
| 8,717,513 B2 | 5/2014 | Park et al. |
| 8,783,065 B2 | 7/2014 | Schillert et al. |
| 8,840,997 B2 | 9/2014 | Koyama et al. |
| 8,898,824 B2 | 12/2014 | Neidich et al. |
| 9,001,503 B1 * | 4/2015 | Hibino ................ H05K 5/0217 361/679.01 |
| 9,069,198 B2 | 6/2015 | Kim et al. |
| 9,125,298 B2 | 9/2015 | Russell-Clarke |
| 9,134,547 B2 | 9/2015 | McCabe et al. |
| 9,140,522 B1 | 9/2015 | Miller et al. |
| 9,154,678 B2 | 10/2015 | Kwong et al. |
| 9,193,625 B2 | 11/2015 | Bookbinder et al. |
| 9,242,889 B2 | 1/2016 | Yamakaji et al. |
| 9,249,045 B2 | 2/2016 | Gabel et al. |
| 9,263,209 B2 * | 2/2016 | Chen ..................... H01H 13/83 |
| 9,302,937 B2 | 4/2016 | Gulati et al. |
| 9,321,677 B2 | 4/2016 | Chang et al. |
| 9,359,251 B2 | 6/2016 | Bookbinder et al. |
| 9,375,900 B2 | 6/2016 | Tsuchiya et al. |
| 9,390,930 B2 | 7/2016 | Rogers et al. |
| 9,392,706 B2 | 7/2016 | Yoo et al. |
| 9,474,174 B2 * | 10/2016 | Motohashi ........... H05K 5/0217 |
| 9,516,149 B2 | 12/2016 | Wright et al. |
| 9,522,836 B2 | 12/2016 | Gulati et al. |
| 9,524,413 B2 * | 12/2016 | Kim ..................... G06V 40/13 |
| 9,632,537 B2 | 4/2017 | Memering et al. |
| 9,674,322 B2 | 6/2017 | Motohashi et al. |
| 9,678,540 B2 | 6/2017 | Memering et al. |
| 9,718,727 B2 | 8/2017 | Bookbinder et al. |
| 9,840,435 B2 | 12/2017 | Ohara et al. |
| 9,890,074 B2 | 2/2018 | Liu |
| 9,897,574 B2 | 2/2018 | Roussev et al. |
| 9,902,138 B2 | 2/2018 | Edwards |
| 9,902,641 B2 | 2/2018 | Hall et al. |
| 9,946,302 B2 | 4/2018 | Franklin et al. |
| 10,133,156 B2 | 11/2018 | Pilliod et al. |
| 10,141,133 B2 * | 11/2018 | Bae ..................... G07C 9/00563 |
| 10,146,982 B2 * | 12/2018 | Hsu ..................... H04N 17/002 |
| 10,189,228 B2 | 1/2019 | Couillard et al. |
| 10,286,631 B2 | 5/2019 | Alder et al. |
| 10,324,496 B2 | 6/2019 | Kwong et al. |
| 10,357,945 B2 | 7/2019 | Beall et al. |
| 10,494,860 B1 | 12/2019 | Jones et al. |
| 10,694,010 B2 | 6/2020 | Jones et al. |
| 10,702,211 B2 | 7/2020 | Clavelle et al. |
| 10,800,141 B2 | 10/2020 | Bartlow et al. |
| 10,827,635 B1 | 11/2020 | Limarga et al. |
| 10,875,277 B2 | 12/2020 | Aoki et al. |
| 10,917,505 B2 | 2/2021 | Jones et al. |
| 10,919,270 B2 | 2/2021 | Oh et al. |
| 11,192,823 B2 | 12/2021 | Li et al. |
| 11,199,929 B2 | 12/2021 | Poole et al. |
| 2003/0040346 A1 | 2/2003 | Fukuda et al. |
| 2003/0062490 A1 | 4/2003 | Fujieda |
| 2004/0003627 A1 | 1/2004 | Hashima |
| 2004/0041504 A1 | 3/2004 | Ozolins |
| 2004/0105026 A1 | 6/2004 | Campbell et al. |
| 2004/0182687 A1 * | 9/2004 | Tsubaki ................. H01H 13/14 200/341 |
| 2005/0135724 A1 | 6/2005 | Helvajian |
| 2005/0176506 A1 * | 8/2005 | Goto ................... G05G 9/04788 463/37 |
| 2008/0049980 A1 * | 2/2008 | Castaneda ............. G06V 40/13 382/115 |
| 2008/0237023 A1 * | 10/2008 | Kazama ............... H01H 25/041 200/6 A |
| 2009/0040737 A1 * | 2/2009 | Shimura .............. H04B 1/0346 361/752 |
| 2009/0107824 A1 * | 4/2009 | Ou ....................... H01H 25/041 200/600 |
| 2009/0236206 A1 * | 9/2009 | Wennemer ........... H01H 13/705 29/622 |
| 2010/0013786 A1 | 1/2010 | Nishikawa et al. |
| 2010/0108486 A1 * | 5/2010 | Yoshida ................ H01H 13/85 200/310 |
| 2010/0127420 A1 | 5/2010 | Dannoux |
| 2010/0148996 A1 * | 6/2010 | Wang ..................... H01H 13/83 341/22 |
| 2010/0263708 A1 | 10/2010 | Reichart et al. |
| 2010/0279068 A1 | 11/2010 | Cook et al. |
| 2010/0285310 A1 | 11/2010 | Izutani et al. |
| 2010/0330814 A1 | 12/2010 | Yokota |
| 2011/0038115 A1 * | 2/2011 | Halkosaari ............ H01H 13/83 361/679.08 |
| 2011/0041987 A1 | 2/2011 | Hori et al. |
| 2011/0177300 A1 | 7/2011 | Hankey et al. |
| 2011/0253520 A1 * | 10/2011 | Lim ....................... H01H 13/83 200/5 A |
| 2012/0020045 A1 * | 1/2012 | Tanase ................... H04M 1/18 200/600 |
| 2012/0052271 A1 | 3/2012 | Gomez et al. |
| 2012/0073941 A1 * | 3/2012 | Chen ..................... H01H 13/83 200/310 |
| 2012/0176760 A1 | 7/2012 | Cohen et al. |
| 2012/0206669 A1 | 8/2012 | Kim |
| 2012/0236526 A1 | 9/2012 | Weber |
| 2012/0250273 A1 * | 10/2012 | Kuo .................... H01H 13/705 361/752 |
| 2012/0327325 A1 | 12/2012 | Park et al. |
| 2013/0128434 A1 | 5/2013 | Yamamoto et al. |
| 2013/0236699 A1 | 9/2013 | Prest et al. |
| 2013/0307818 A1 * | 11/2013 | Pope .................... G06V 40/1353 345/174 |
| 2013/0328792 A1 * | 12/2013 | Myers .................. G06F 1/1652 345/173 |
| 2014/0116090 A1 | 5/2014 | Lee et al. |
| 2014/0151320 A1 | 6/2014 | Chang et al. |
| 2014/0192459 A1 * | 7/2014 | Kwong .................. H01H 13/52 361/679.01 |
| 2014/0272298 A1 | 9/2014 | Memering et al. |
| 2014/0285956 A1 | 9/2014 | Russell-Clarke et al. |
| 2014/0311882 A1 * | 10/2014 | Terashita .............. H01H 13/14 200/520 |
| 2015/0002993 A1 * | 1/2015 | Lee ....................... G06F 1/1684 361/679.02 |
| 2015/0030834 A1 | 1/2015 | Morey et al. |
| 2015/0030859 A1 | 1/2015 | Rogers et al. |
| 2015/0044445 A1 | 2/2015 | Garner et al. |

(56) References Cited

U.S. PATENT DOCUMENTS

| | | |
|---|---|---|
| 2015/0071509 A1* | 3/2015 | Myers .............. G06V 40/1329 382/124 |
| 2015/0077830 A1 | 3/2015 | Lin et al. |
| 2015/0093581 A1 | 4/2015 | Murata et al. |
| 2015/0104618 A1 | 4/2015 | Hayashi et al. |
| 2015/0122406 A1 | 5/2015 | Fisher et al. |
| 2015/0163382 A1 | 6/2015 | Kwong et al. |
| 2015/0165548 A1 | 6/2015 | Marjanovic et al. |
| 2015/0202854 A1 | 7/2015 | Tsuchiya et al. |
| 2015/0212247 A1 | 7/2015 | Borrelli et al. |
| 2015/0232366 A1 | 8/2015 | Fredholm et al. |
| 2015/0241732 A1 | 8/2015 | Kim et al. |
| 2015/0245514 A1* | 8/2015 | Choung .............. H01H 13/06 361/679.01 |
| 2015/0274572 A1 | 10/2015 | Wada et al. |
| 2015/0299036 A1 | 10/2015 | Ukrainczyk et al. |
| 2016/0028931 A1 | 1/2016 | Kwong et al. |
| 2016/0083282 A1 | 3/2016 | Jouanno et al. |
| 2016/0137550 A1 | 5/2016 | Murata et al. |
| 2016/0172129 A1* | 6/2016 | Zercoe .............. H01H 13/79 200/5 A |
| 2016/0224142 A1 | 8/2016 | Yang et al. |
| 2016/0270247 A1 | 9/2016 | Jones et al. |
| 2016/0357294 A1 | 12/2016 | Czeki et al. |
| 2016/0377768 A1 | 12/2016 | Wilson et al. |
| 2017/0025234 A1* | 1/2017 | Huang .............. H01H 13/023 |
| 2017/0059749 A1 | 3/2017 | Wakatsuki et al. |
| 2017/0066223 A1 | 3/2017 | Notsu et al. |
| 2017/0091514 A1* | 3/2017 | Kang .............. G06F 3/0482 |
| 2017/0125190 A1* | 5/2017 | Tu .............. H01H 13/14 |
| 2017/0282503 A1 | 10/2017 | Peng et al. |
| 2017/0300114 A1 | 10/2017 | Matsuyuki et al. |
| 2017/0305788 A1 | 10/2017 | Nikulin |
| 2017/0311466 A1 | 10/2017 | Memering et al. |
| 2017/0334770 A1 | 11/2017 | Luzzato et al. |
| 2017/0340518 A1 | 11/2017 | Logunov et al. |
| 2017/0355633 A1 | 12/2017 | Cook et al. |
| 2017/0364172 A1 | 12/2017 | Kim et al. |
| 2017/0372112 A1 | 12/2017 | Baker et al. |
| 2018/0009697 A1 | 1/2018 | He et al. |
| 2018/0024274 A1 | 1/2018 | Rogers et al. |
| 2018/0086026 A1 | 3/2018 | Nguyen et al. |
| 2018/0086663 A1 | 3/2018 | Luzzato et al. |
| 2018/0088399 A1 | 3/2018 | Fukushi et al. |
| 2018/0125756 A1 | 5/2018 | Gerrish et al. |
| 2018/0126704 A1 | 5/2018 | Zhang et al. |
| 2018/0134606 A1 | 5/2018 | Wagner et al. |
| 2018/0154615 A1 | 6/2018 | Dohn et al. |
| 2018/0237325 A1 | 8/2018 | Li et al. |
| 2018/0282207 A1 | 10/2018 | Fujii et al. |
| 2018/0304588 A1 | 10/2018 | Harris et al. |
| 2018/0304825 A1 | 10/2018 | Mattelet et al. |
| 2018/0326704 A1 | 11/2018 | Harris et al. |
| 2018/0370843 A1 | 12/2018 | Gross et al. |
| 2019/0022979 A1 | 1/2019 | Luzzato et al. |
| 2019/0030861 A1 | 1/2019 | Bellman et al. |
| 2019/0033144 A1 | 1/2019 | Andrews et al. |
| 2019/0037690 A1 | 1/2019 | Wilson et al. |
| 2019/0134944 A1 | 5/2019 | Dawson-Elli |
| 2019/0160787 A1 | 5/2019 | Bartlow et al. |
| 2019/0161402 A1 | 5/2019 | Harris et al. |
| 2019/0169061 A1 | 6/2019 | Jones et al. |
| 2019/0177215 A1 | 6/2019 | Jin et al. |
| 2019/0219463 A1 | 7/2019 | Orihara et al. |
| 2019/0263708 A1 | 8/2019 | Bookbinder et al. |
| 2019/0293838 A1 | 9/2019 | Haba et al. |
| 2020/0014780 A1 | 1/2020 | Jones et al. |
| 2020/0017406 A1 | 1/2020 | Wilson et al. |
| 2020/0039186 A1 | 2/2020 | Yuan et al. |
| 2020/0055281 A1 | 2/2020 | Yoon et al. |
| 2020/0095159 A1 | 3/2020 | Marshall et al. |
| 2020/0301527 A1 | 9/2020 | Poole et al. |
| 2020/0339472 A1 | 10/2020 | Yoon et al. |
| 2020/0346525 A1 | 11/2020 | Mannheim Astete et al. |
| 2020/0369560 A1 | 11/2020 | Takeda et al. |
| 2020/0407266 A1 | 12/2020 | Suzuki et al. |
| 2021/0009469 A1 | 1/2021 | Marshall et al. |
| 2021/0014992 A1 | 1/2021 | Limarga et al. |
| 2021/0016547 A1 | 1/2021 | Bartlow et al. |
| 2021/0033757 A1 | 2/2021 | Wilson et al. |
| 2021/0072789 A1 | 3/2021 | Rogers et al. |
| 2021/0303031 A1 | 9/2021 | Poole et al. |
| 2021/0361233 A1 | 11/2021 | Wilson et al. |
| 2022/0117094 A1 | 4/2022 | Prest et al. |

FOREIGN PATENT DOCUMENTS

| | | |
|---|---|---|
| CN | 106007345 | 10/2016 |
| CN | 106341962 | 1/2017 |
| CN | 106485275 | 3/2017 |
| CN | 108017263 | 5/2018 |
| CN | 018285263 | 7/2018 |
| CN | 108285263 | 7/2018 |
| CN | 108545917 | 9/2018 |
| CN | 108632510 | 10/2018 |
| CN | 215010334 | 12/2021 |
| DE | 102016107630 | 10/2017 |
| JP | S6042176 | 9/1985 |
| JP | S6271215 | 5/1987 |
| WO | WO2010/077845 | 7/2010 |
| WO | WO2012/027660 | 3/2012 |
| WO | WO2012/074983 | 6/2012 |
| WO | WO2014/022356 | 2/2014 |
| WO | WO2014/022681 | 2/2014 |
| WO | WO2015/031420 | 3/2015 |
| WO | WO2015/095089 | 6/2015 |
| WO | WO2016/065118 | 4/2016 |
| WO | WO2017/196800 | 11/2017 |
| WO | WO2019/199791 | 10/2019 |

OTHER PUBLICATIONS

Bourhis, "Production Control of Residual Stresses," Glass Mechanics and Technology, Second Edition, pp. 236-243, 2014.

Mao et al., "Fabrication and characterization of 20 nm planar nanofluidic channels by glass-glass and glass-silicon bonding," www.rsc.org/loc, 8 pages, Jun. 30, 2005.

Moriceau et al., "Overview of recent direct wafer bonding advances and applications," Advances in Natural Sciences: Nanoscience and Nanotechnology, vol. 1, No. 043004, 11 pages, 2010.

Decourcelle, et al., "Controlling Anisotropy," Conference Proceedings, All Eyes on Glass, Glass Performance Days, Tampere, Finland, Jun. 28-30, 2017.

Dudutis et al., Bessel beam asymmetry control for glass dicing applications, Procedia CIRP 74, pp. 333-338, 2018.

Gottmann et al., "Microcutting and Hollow 3D Microstructures in Glasses by InVolume Selective Laser-induced Etching," Journal of Laser Micro / Nanoengineering, vol. 8, No. 1, pp. 15-18, Jan. 2013.

Jenne et al., "High-quality Tailored-edge Cleaving Using Aberration-corrected Bessel-like Beams," arXiv:2010.10226v1 [physics.optics], May 8, 2018.

Ungaro et al., "Using phase-corrected Bessel beams to cut glass substrates with a chamfered edge," Applied Optics, vol. 60, No. 3, p. 714, Dec. 10, 2020.

\* cited by examiner

FORMING GLASS COVERS FOR ELECTRONIC DEVICES

CROSS-REFERENCE TO RELATED APPLICATION(S)

This application is a continuation patent application of U.S. patent application Ser. No. 15/710,352, filed Sep. 20, 2017 and titled "Forming Glass Covers for Electronic Devices," which is a nonprovisional patent application of and claims the benefit of U.S. Provisional Patent Application No. 62/398,483, filed Sep. 22, 2016 and titled "Forming Glass Covers for Electronic Devices," the disclosures of which are hereby incorporated herein by reference in their entireties.

FIELD

The present invention relates generally to forming glass covers for electronic devices, and more particularly to forming shaped glass sheets and removing portions of the sheets to form openings in glass covers.

BACKGROUND

Electronic devices are ubiquitous in society and can be found in everything from wristwatches to computers. Many hand-held devices include input devices such as buttons, keys, touch-sensitive input devices (e.g., trackpads, touchscreens), as well as output devices such as displays, that facilitate user interactions with the device. In certain applications, glass or other transparent covers are positioned over the input and/or output devices, or over other portions of the electronic device. The covers may protect sensitive components and may define interface surfaces that directly receive physical inputs, such as touches and presses.

SUMMARY

A cover for an electronic device includes a glass sheet defining a substantially planar first surface, a substantially planar second surface opposite the first surface, an opening extending through the glass sheet, and a wall surrounding and extending from the opening.

The wall may extend a distance relative to the second surface. The wall may define a top surface that is substantially parallel with the second surface, and the first surface may define an exterior surface of an electronic device. The top surface may be a machined surface, and wall may have an unmachined exterior surface and an unmachined interior surface.

The opening may be a first opening, the wall may be a first wall, and the glass sheet may further define a second opening extending through the glass sheet, and a second wall surrounding and extending from the second opening. The first and second walls may extend substantially the same height above the second surface.

A cover for an electronic device includes a glass sheet defining a first surface, a second surface parallel to and set apart from the first surface by a thickness, and a third surface defining a sidewall of an opening that extends through the glass sheet and having a height that is greater than the thickness of the glass sheet.

The glass sheet may further define a raised wall surrounding the opening, the third surface may define an inner surface of the raised wall, and a fourth surface may define an outer surface of the raised wall. The opening may be substantially rectangular.

The glass sheet may be incorporated with an electronic device including a housing, a processor within the housing, and a touch-sensitive input device within the housing and below the glass sheet. The glass sheet may define an input surface for the touch-sensitive input device. The glass sheet may facilitate capacitive coupling between the touch-sensitive input device and an object in contact with the input surface.

A method of forming a glass cover for an electronic device includes positioning a glass sheet on a shaped mold, conforming the glass sheet to the shaped mold, solidifying the glass sheet to form a shaped glass sheet comprising a surface defining a high relief portion and a low relief portion, and removing at least a portion of the high relief portion, thereby forming a glass cover defining an opening for the electronic device. Removing the portion of the high relief portion may include grinding the shaped glass sheet with a grinding tool.

The surface may be a first surface, the glass sheet may further comprise a second surface opposite the first surface, and the second surface may define an exterior surface of the electronic device.

Prior to removing the portion of the high relief portion, the shaped glass sheet may be removed from the shaped mold. Conforming the glass sheet to the mold may comprise applying pressure to the glass sheet. Conforming the glass sheet to the mold may comprise applying a vacuum to the glass sheet through the shaped mold, thereby drawing the glass sheet against a surface of the shaped mold.

The shaped mold may be a first shaped mold having a first set of contours corresponding to the high relief portions and low relief portions of the glass sheet, applying the pressure to the glass sheet may include contacting the glass sheet with a second shaped mold having a second set of contours that is complementary to the high relief portions and the low relief portions of the glass sheet.

A method may include positioning a contoured glass sheet in a fixture, the contoured glass sheet including a first portion, a second portion recessed relative to the first portion, and a joining segment joining the second portion to the first portion. The method may further include separating the second portion from the first portion by cutting along the joining segment, thereby forming a perforated sheet from the first portion. The method may further include coupling the perforated sheet to a housing of an electronic device.

The cutting may include directing a cutting beam onto the joining segment. The cutting beam may be a laser beam.

The perforated sheet may include an opening corresponding to the second portion which was removed from the contoured glass sheet, and the method may further include positioning the second portion in the opening and coupling the second portion to an input device within the electronic device and below the opening of the perforated sheet. The input device may be a force-sensitive input device. The input device may be a touch-sensitive input device. The input device may be a mechanical input device.

The method may further include positioning the perforated glass sheet over a touch-sensitive input device. The touch-sensitive input device may be a touch-sensitive display.

A method of forming a glass cover for an electronic device may include conforming a glass sheet to a shaped mold defining at least one contour, and cooling the glass sheet to form a shaped glass sheet defining at least one indented portion corresponding to the at least one contour in the shaped mold, and a flange portion surrounding the at least one indented portion. The method may further include removing the shaped glass sheet from the shaped mold and separating the at least one indented portion from the flange portion to form at least one glass cover for an electronic device.

The separating may include machining the flange portion of the shaped glass sheet to singulate the at least one indented portion. The separating may include machining the at least one indented portion of the shaped glass sheet to produce a perforated glass sheet. The machining the at least one indented portion may include grinding the at least one indented portion.

The at least one glass cover may be coupled to an input device within the electronic device. The input device may be a force-sensitive device. The force-sensitive device may be a trackpad of a laptop computer.

The flange portion may define a perforated glass sheet. The method may further include coupling the perforated glass sheet to a housing of an electronic device.

An electronic device may include a housing, a base structure, a cover coupled to the housing and having aperture, and an input device. The input device may include a glass button cover positioned within the aperture of the cover and defining a molded top surface defining an exterior surface of the input device and a machined bottom surface. The input device may further include a sub-structure coupled to the glass button cover, and a support mechanism movably supporting the sub-structure and the glass button cover relative to the base structure. The machined bottom surface may be substantially planar. The cover may be formed of glass.

The molded top surface may have a concave shape, and the glass button cover may further include a raised feature extending from the molded top surface. The glass button cover may be coupled to the sub-structure with adhesive.

A thickness at a central region of the glass button cover may be between about 0.3 mm and about 0.5 mm, and a thickness at an outer region of the glass button cover may be between about 0.6 mm to about 0.75 mm. The glass button cover may have a substantially square outer perimeter.

The input device may include a collapsible dome below the sub-structure, the collapsible dome biasing the sub-structure and glass button cover towards a biased position.

A method may include positioning a glass sheet on a shaped mold, conforming the glass sheet to the shaped mold, solidifying the glass sheet to form a shaped glass sheet defining a protrusion extending above a web portion, and separating the protrusion from the web portion, thereby forming a perforated glass sheet corresponding to the web portion and an input device cover corresponding to the protrusion. Separating the protrusion from the web portion may include cutting a joining segment connecting the protrusion to the web portion with a wire saw. The method may further include attaching the input device cover to a sub-structure of an input device. The method may further include positioning the perforated glass sheet over a touch-sensitive input device.

The shaped mold may contact substantially an entire bottom surface of the glass sheet during the conforming, and conforming the glass sheet to the shaped mold may further include applying a partial mold to less than an entire top surface of the glass sheet prior to solidifying the glass sheet. The partial mold may contact the web portion of the shaped glass sheet.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
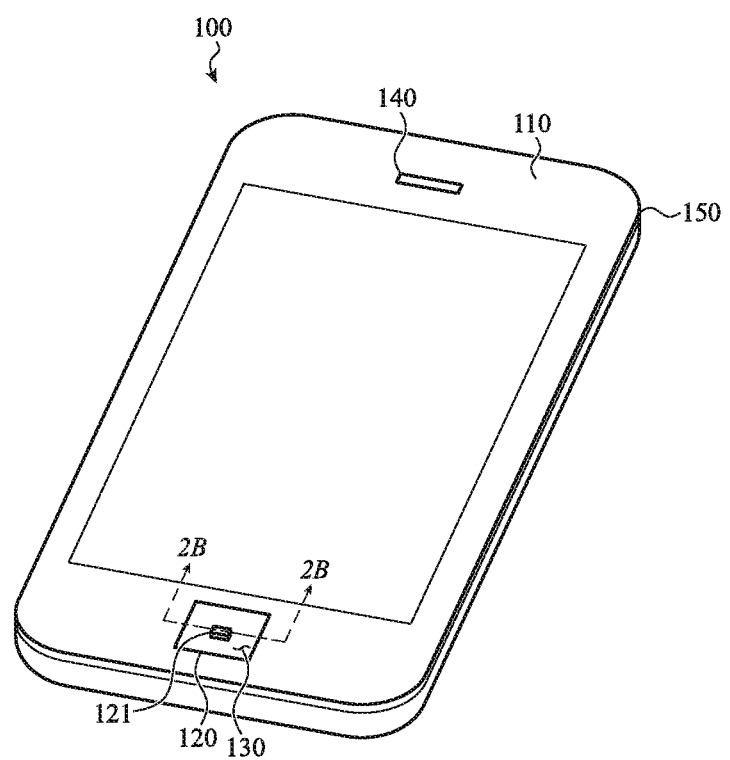
FIG. 1 shows an example electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Glass covers may be used to cover various different portions of electronic devices. For example, glass covers may be positioned over a touch-sensitive input device or a force-sensitive input device to provide an interface surface for the touch- or force-sensitive input devices. Glass covers may have beneficial structural properties that make them well suited for such applications, such as high hardness, a smooth surface, and suitable dielectric properties to facilitate detection of force or touch inputs applied to the covers. Moreover, where the glass covers overlie displays or other visual output devices, the transparency of the glass allows the displays to be viewed while also protecting the display. Glass covers may either be fully transparent, such as when they overlie a display, or they may be textured using a secondary surface treatment or any other suitable texturing process.

Glass covers for electronic devices may include openings or apertures therethrough. For example, a glass cover for a mobile phone may include openings over audio components, such as speakers and microphones, to allow sound to pass through the cover. As another example, an electronic device may have a camera lens that extends through an opening in a glass cover. As yet another example, a button, or part of a button, may be positioned in an opening in a glass cover.

Described herein are techniques for forming glass covers for electronic devices. For example, a glass sheet may be positioned over a shaped mold and then heated to the transition temperature (e.g., the softening point) of the glass material. At the transition temperature, the glass sheet will soften and slump over the shaped mold. In the slumping process, the glass sheet conforms to the shape (e.g., the contours) of the mold and is cooled, thereby forming a contoured sheet. More particularly, the shaped mold may have a surface defining bumps, depressions, recesses, areas of high relief, areas of low relief, or other shapes or contours. When the glass is slumped over the surface of the mold and cooled, the resulting glass sheet corresponds to the shape (e.g., the areas of high and low relief) of the mold. For example, a bump or protrusion on the surface of the mold may produce a corresponding bump or protrusion in the shaped glass sheet. Once the shaped glass sheet is cooled, it may be removed from the shaped mold.

The contours of the shaped glass sheet may define areas that are formed into apertures or openings in a finalized glass cover. For example, a sheet of glass may be slumped over a mold that has a protruding portion, resulting in a shaped glass sheet with a corresponding protrusion. In order to form an aperture or opening, the protrusion can be removed to produce a perforated glass sheet. The removal of the protrusion can be by grinding the protrusion with a grinding or lapping tool, or by cutting the protrusion from the remaining portion of the sheet with a laser beam (e.g., cutting beam), wire saw, or other suitable cutting tool or technique.

The perforated sheet can then be coupled to an electronic device such that the aperture (or apertures) formed by removing protruding portions align with certain components of an electronic device. For example, an aperture may align with a speaker, button, key, optical lens, or any other suitable component of the electronic device. A portion of the glass sheet may also cover input devices, displays, or other components of an electronic device.

Furthermore, the cover glass can be coupled to input devices of the electronic device, such as force-sensitive and touch-sensitive input devices. For example, the protruding portion that is cut from the shaped glass sheet may be incorporated for used to cover input devices, such as a button or a touch-sensitive input device (e.g., a touch-sensitive display). The shape of the cover glass may be circular, rectangular, or any shape that will conform with the input device and permit coupling with the electronic device. In a further example, the shaped glass may be formed in such a way that a piece of glass removed to form an aperture in the shaped glass sheet may be used as a cover for an input device. For example, a cover may have an opening that corresponds to a button, and the piece of glass removed to form the opening may be used as a cover for the button.

Although one or more of these processes may be described in detail in the context of handheld devices, such as mobile phones, laptops, and notebooks, the embodiment disclosed should not be interpreted or otherwise used as limiting the scope of the disclosure, including the claims. In addition, one skilled in the art will understand that the following description has broad application. Accordingly, the discussion of any embodiment is meant only to be exemplary and is not intended to suggest that the scope of the disclosure, including the claims, is limited to these embodiments.

FIG. 1 shows an example device 100. The device 100 shown in FIG. 1 is a mobile phone (e.g., a smartphone), but this is merely one representative example of a device that may be used in conjunction with the ideas disclosed herein. Other example devices include, without limitation, music/media players, tablet computers, laptop computers, wearable electronic devices, watches (e.g., mechanical, electrical, or electromechanical), keyboards, and the like. Moreover, while the ideas disclosed herein are primarily described with reference to glass covers for electronic devices, the ideas are also applicable to glass (or other material) covers for other devices or applications.

FIG. 1 illustrates a handheld device 100, such as a mobile phone. The electronic device 100 includes a housing 150 and a cover 110, which may cover or otherwise overlie a display and/or a touch-sensitive input device (e.g., a touchscreen). The cover 110 may be made of a material such as glass, plastic, sapphire, or any other suitable material. The device 100 may also include internal components, such as processors, memory, circuit boards, batteries, sensors, and the like. Such components may be disposed within an internal volume defined at least partially by the housing 150.

The cover 110 may have one or more openings or apertures to accommodate input and/or output devices. For example, as shown in FIG. 1, a first opening 120 may be provided for an input device (e.g., a button, fingerprint sensor, or the like) to enable mechanical inputs to be received by the central processor. This input device may respond to mechanical pressure and may control operations of the device 100 in response to detected inputs. For example, the input device may control applications that are operating on the device 100, cause the device 100 to power-on or unlock, or the like. The cover 110 may also define a second opening 140, which may be adjacent or proximate a speaker. For example the second opening 140 may allow audio to pass through the cover 110 and to a user.

Non-perforated glass covers may also be provided to cover input devices such as buttons, fingerprint sensors, and the like. For example, a button cover 130 may overlie or be coupled to an input device such as a button. The button cover 130 may fit within the first opening 120 in the cover 110 (or an opening in any other component or structure of an electronic device). The button cover 130 may optionally include a raised feature 121, which may allow the user to tactilely locate the button and/or differentiate the button from surrounding areas of the cover 110 or the device 100 more generally. The button cover 130 may have a substantially planar external surface (e.g., the surface that is pressed by a user to actuate the button), or it may be contoured, such as convex or concave. Further, while the button cover 130 is shown as having a substantially square shape, other shapes are also contemplated, such as circular, rectangular, and the like. Although non-perforated glass covers are discussed in the context of an input device of an electronic device, the glass cover concept may be applied to a variety of peripheral devices, such as pressure-sensitive displays, gaming controllers, and so on.

The cover 110, with its exemplary openings, and the button cover 130 may be produced from the same sheet of glass by a method disclosed herein. For example, a glass sheet may be slumped over a mold to form a glass sheet with contours that correspond to the desired openings. A portion of the contoured sheet that is removed to form an opening (and thereby form the cover 110) may be used as a cover for an input device on the same electronic device as the cover 110 (e.g., the button cover 130). In other cases, the cover 110 and/or the button cover 130 may be formed from different sheets of glass. For example, as described herein, multiple button covers may be formed from a single sheet of glass.

While embodiments are disclosed herein where the handheld device 100 is discussed in the context of a mobile phone, the handheld device 100 may take a variety of forms, such as a laptop computing system, a personal digital assistant, an electronic notebook, a portable gaming system, and so on.

Figure 2A:
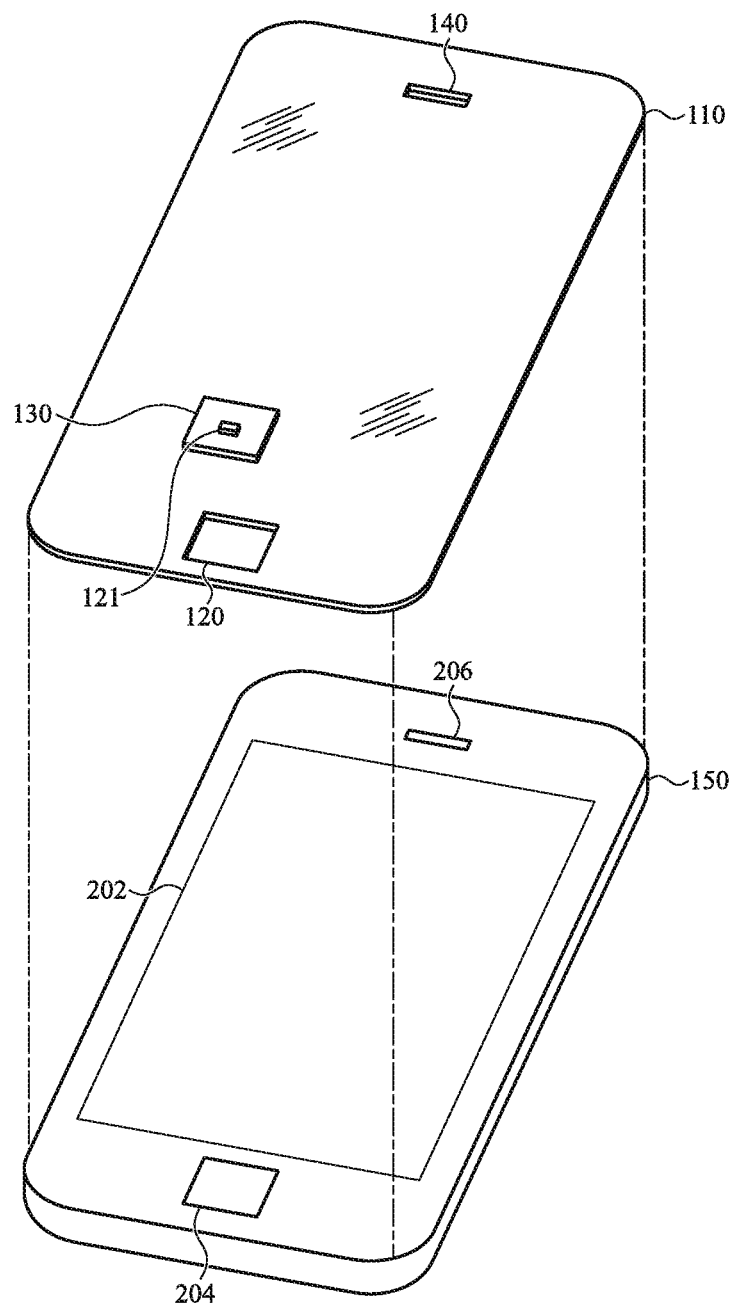
FIG. 2A shows an exploded view of the electronic device of FIG. 1.

FIG. 2A is an exploded view of the handheld device 100 of FIG. 1, showing the cover 110 and the button cover 130 removed from the housing 150. As shown in FIG. 2A, the cover 110 overlies and may be coupled to a display 202 that is positioned within and coupled to the housing 150. The display 202 may be a touch-sensitive and/or force-sensitive display, as described above, and may include display components (e.g., lighting elements, filters, polarizers, liquid crystal layers) as well as input sensing components (e.g., capacitive sensors, resistive sensors, piezoelectric sensors).

The button cover 130 overlies and may be part of or coupled to an input device 204, and is positioned in the first opening 120. The input device 204 may include electrical and mechanical components, such as dome switches, spring members, haptic actuators, and/or other mechanisms to provide mechanical or tactile button functions, as described with respect to FIG. 2B. Additionally or alternatively, the input device 204 may include touch- and/or force-sensitive components, such as capacitive, resistive, or optical sensors (or other types of sensors) that detect user inputs and control operations of the device 100. In some cases, the touch- and/or force-sensitive components detect the presence and/or proximity of an implement such as a finger, stylus, or the like, by electrically sensing the implement. Accordingly, the button cover 130 (or any glass cover described herein that overlies a touch- and/or force-sensitive input) may be formed from a dielectric material, such as glass, sapphire, or any other material that facilitates or otherwise does not interfere with a sensor's ability to electrically sense objects applied thereto.

The button cover 130 may have any suitable dimensions. For example, the button cover 130 may be configured to be operated (e.g., pressed) by one finger of a user, and as such may have a size that is convenient and comfortable for one-finger operation. For example, where the button cover 130 is a square (as shown) or rectangle, the button cover 130 may have a length along each side between about 1.0 cm and about 2.0 cm. Where the button cover 130 is a circle, the button cover 130 may have a diameter between about 1.0 cm and about 2.0 cm. Other shapes and dimensions are also possible.

Figure 2B:
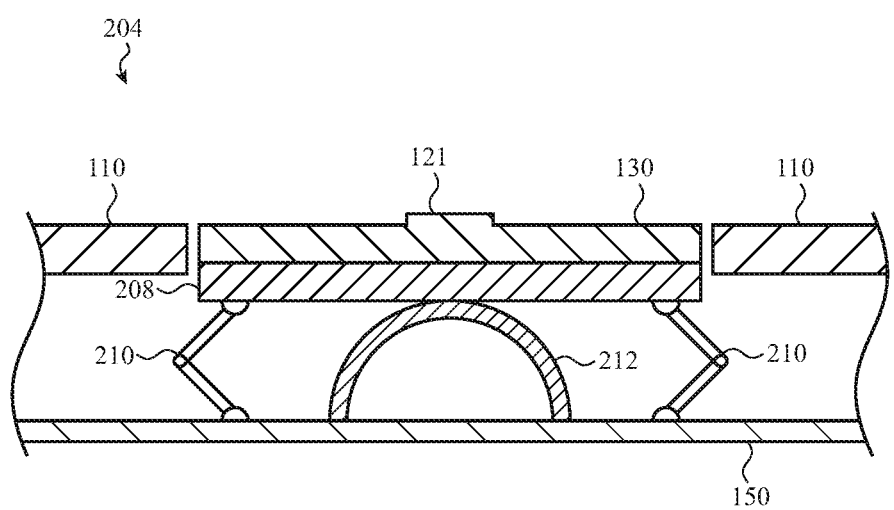
FIG. 2B shows a partial cross-sectional view of an input device of the electronic device of FIG. 1.

The button cover 130 may be coupled to a sub-structure of the input device 204, which may in turn be coupled to mechanical support structures such as hinges, guides, pivoting and/or articulating mechanisms, and the like. For example, FIG. 2B shows a partial cross-sectional view of the electronic device 100, viewed along line 2B-2B in FIG. 1, showing details of the input device 204. The input device 204 includes the button cover 130, which may be coupled to a sub-structure 208. The sub-structure 208 may be any suitable material, such as plastic, and the button cover 130 may be coupled to the sub-structure 208 in any suitable way, such as with adhesives, mechanical interlocking structures, threaded fasteners, clips, and the like. In some cases, interstitial components or materials may be between the sub-structure 208 and the button cover 130, such as adhesives, glues, bonding agents, polymer layers, fabrics, or the like.

The sub-structure 208 (or the button cover 130 itself, if the sub-structure 208 is not used) may be movably supported relative to a base structure, such as the housing 150, by a support mechanism 210. As shown, the support mechanism 210 includes linked members that may guide the button cover 130 along a substantially linear path. Other types of support mechanisms 210 may also be used, such as telescoping guides, scissor mechanisms, hinges, or the like.

The input device 204 may also include a switching component that produces a signal or other detectable event when the input device is actuated (e.g., when the button cover 130 is pressed by a user). For example, as shown in FIG. 2B, the input device 204 includes a collapsible dome 212. The collapsible dome 212 may be formed from any suitable material or materials, such as rubber, plastic, metal, or the like. When collapsed, deformed, or deflected by downward movement of the button cover 130 and sub-structure 208, the collapsible dome 212 may close an electrical circuit. The electronic device 100 may detect the closure of the circuit and register an input (and perform a function or operation in response to registering the input). The collapsible dome 212 may also provide a biasing force that biases the sub-structure 208 and button cover 130 towards a biased or unactuated position (e.g., an upward force, as shown in FIG. 2B). The collapsible dome 212 may also provide a desired tactile response to the button cover 130 when the button cover 130 is actuated, such as a click or detent.

Returning to FIG. 2A, this figure also illustrates the relative positioning of the second opening 140 with respect to a speaker 206 (or a speaker port coupled to a speaker). As noted above, the opening 140 may be configured to communicate with the speaker 206 to allow sound to pass from the interior of the electronic device 100 through the cover 110.

Figure 3:
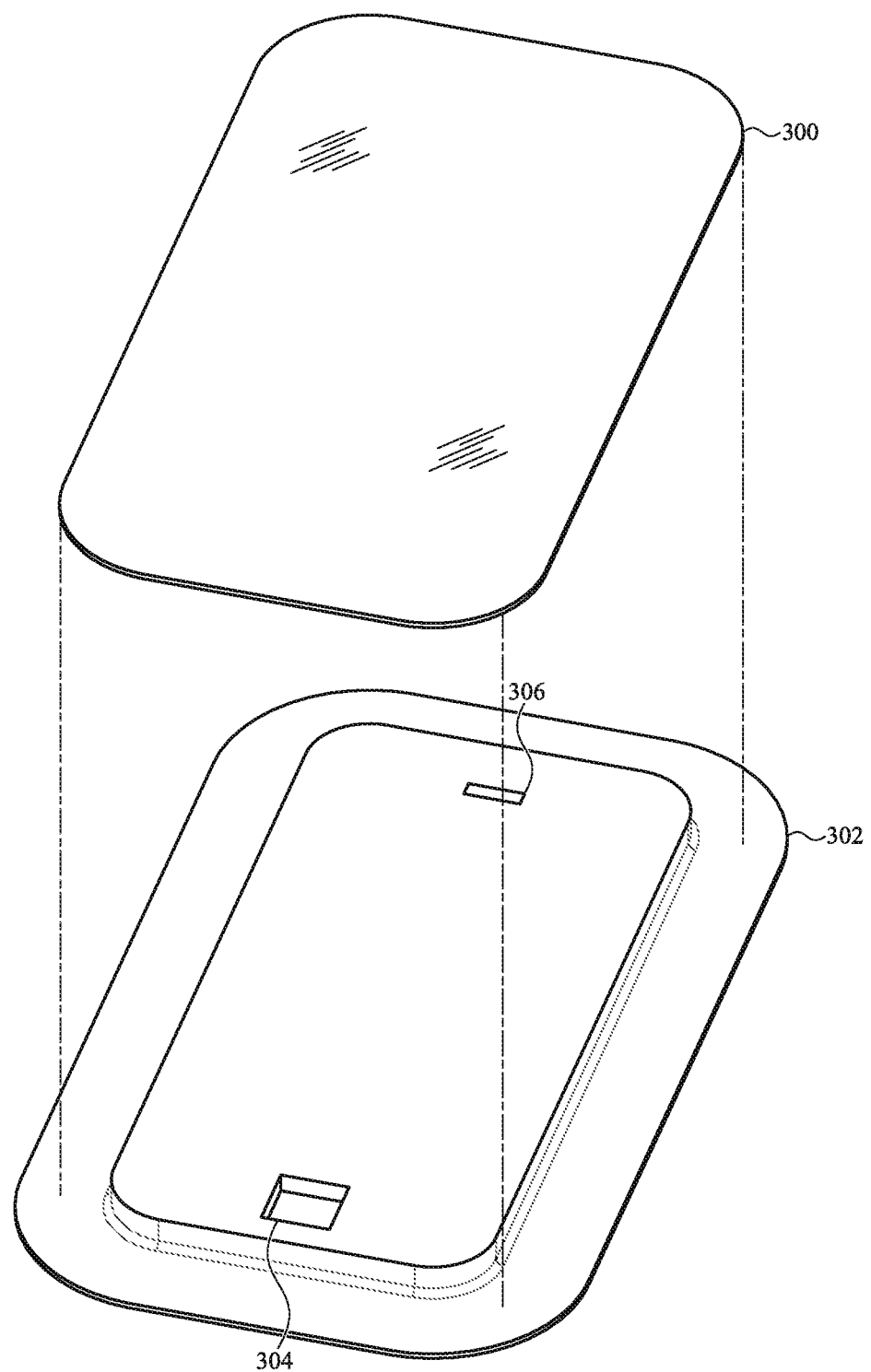
FIGS. 3-5 show an example process for forming a glass cover.
Figure 4A:
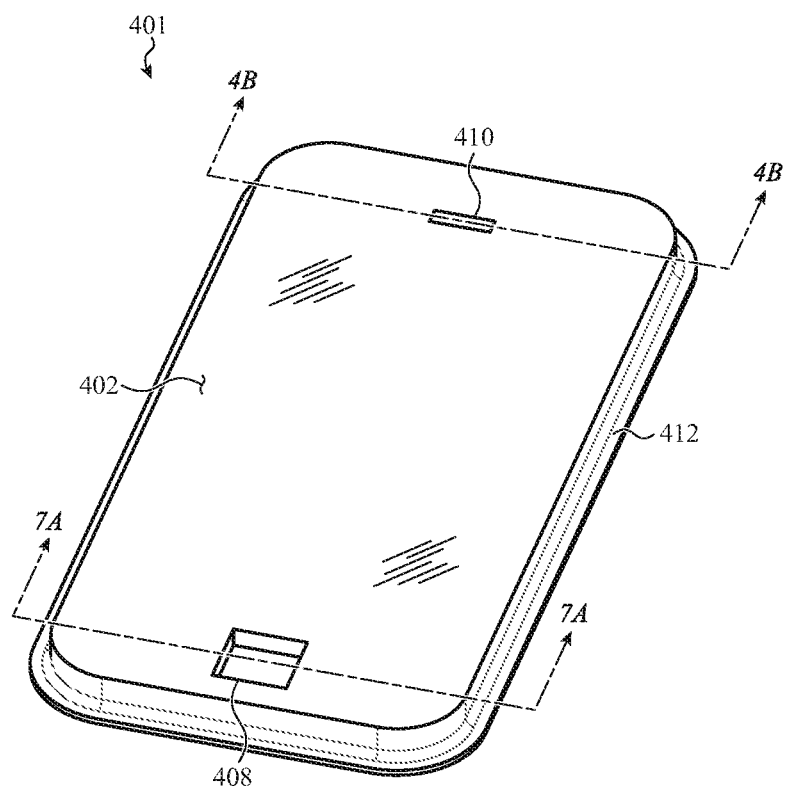
Figure 4B:
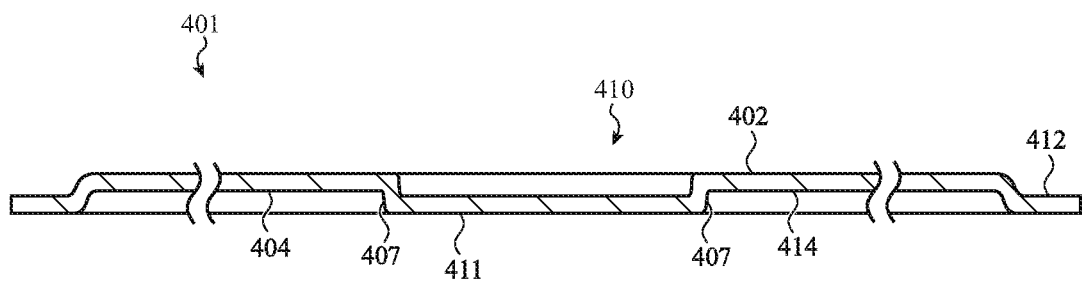
Figure 5:
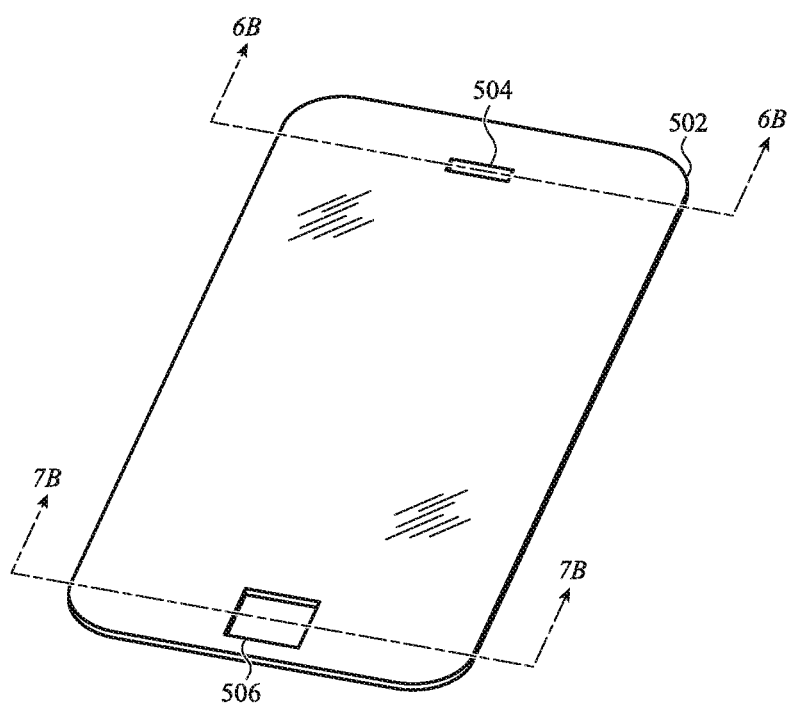

FIGS. 3-5 illustrate an example process for forming a monolithic glass cover, such as the cover 110, for an electronic device. FIG. 3 shows a glass sheet 300 positioned over a shaped mold 302. As shown, the glass sheet 300 is substantially planar and has a substantially uniform thickness. For example, the glass sheet may have a substantially uniform thickness between about 0.02 mm and about 3.0 mm.

The glass sheet may be formed from or may include any suitable glass, such as borosilicate glass, aluminosilicate glass, soda lime glass, chemically strengthened glass, or any other suitable glass. The glass sheet 300 may be formed from or may include materials other than glass, such as sapphire or any other material that may be formed by the molding process described herein.

The shaped mold 302 may have contours (e.g., protrusions, cavities, channels, depressions, or the like) that are configured to form corresponding contours in the glass sheet 300. For example, the shaped mold 302 includes a first recess 304 and a second recess 306. The first recess 304 may be configured to produce a recess or indentation in the glass sheet 300 that will ultimately be removed to form an aperture or opening (e.g., the first opening 120, FIG. 1) for a button cover. Similarly, the second recess 306 may be configured to produce a recess or indentation in the glass sheet 300 that will ultimately be removed to form an aperture (e.g., the second opening 140, FIG. 1) for a speaker or other audio component.

The glass sheet 300 may be formed against the mold 302. This process may be referred to as slumping, and may include heating the glass sheet 300 and/or the mold 302, applying the glass sheet 300 to the mold 302, and causing the glass to conform to the shape of the mold 302 (e.g., by applying pressure from another mold part or with a vacuum molding system). After the glass sheet 300 is formed against the mold 302 and hardened (e.g., by cooling), the glass sheet 300, now a monolithic shaped glass sheet, may be removed from the mold 302 for further processing.

FIG. 4A shows a shaped glass sheet 401 corresponding to the glass sheet 300 after molding. The shaped glass sheet 401 includes a first recess 408 (corresponding to the first recess 304 in the mold 302) and a second recess 410 (corresponding to the second recess 306 in the mold 302). The shaped glass sheet 401 may also have a border or flange portion 412 where the glass sheet 300 conformed to an outer edge of the mold 302. As described herein, the recesses 408, 410, or indented portions, of the shaped glass sheet 401 may be removed to form apertures or openings, thereby forming a perforated glass sheet.

FIG. 4B shows a partial cross-sectional view of the shaped glass sheet 401, viewed along line 4B-4B in FIG. 4A. FIG. 4B illustrates how the glass sheet 300 conforms to the recesses in the mold 302. In particular, the shaped glass sheet 401 includes the second recess 410, which was formed by the glass conforming to the second recess 306 in the mold 302. The shaped glass sheet 401 may also include a border portion 412 where the glass sheet 300 conformed to an outer edge of the mold 302.

A top surface 402 of the shaped glass sheet 401 may be configured to define an exterior surface of an electronic device (e.g., the electronic device 100), and may also define an input surface of an input device (e.g., a touchscreen of the electronic device 100). A bottom surface 404 of the shaped glass sheet 401 may be configured to face an interior portion of the electronic device 100. The top surface 402 and the bottom surface 404 may be substantially planar.

The shaped glass sheet 401 may be formed so that any grinding or machining that is used to remove the recessed portions and form the openings occurs only on or adjacent the bottom surface 404. Accordingly, the top surface 402 is not marred or otherwise subjected to physical operations that may scratch or otherwise damage the top surface 402.

From the perspective of the top surface 402, the first and second recesses 408, 410 are recessed relative to the top surface 402. However, from the perspective of the bottom surface 404, the first and second recesses 408, 410 appear as protrusions. More particularly, from the perspective of the bottom surface 404, the second recess 410 defines an area of high relief 411, while the non-recessed portions (e.g., those portions that are not intended to form openings) define an area of low relief 414. Similarly, the border portion 412 may be an area of high relief. As used herein, areas of high relief and low relief on a sheet are described relative to a surface that is subjected to a removal operation (e.g., grinding, milling, laser cutting, etc.), regardless of the profile of the opposite side of the sheet. For example, with reference to FIG. 4B, the area of high relief 411 is removed (using a cutting operation directed to the bottom surface 404) to form a perforated cover. Thus, the area 411 is referred to as an area of high relief even though, as viewed from the top surface 402, it may appear as a recess or area of low relief.

FIG. 5 shows a perforated glass sheet 502, corresponding to the shaped glass sheet 401 after the border or flange portion 412 has been removed, and after the bottom portions of the recesses 408, 410 have been removed to form openings 506, 504 (corresponding to the openings 120, 140 in FIG. 1). The perforated glass sheet 502 (which may be monolithic) may be used as a cover for an electronic device, such as the cover 110 shown in FIGS. 1 and 2.

By slumping the glass to form recesses and corresponding protruding portions (e.g., the portions of the recesses that protrude from the bottom surface of the sheet), openings can be formed by grinding away or otherwise removing the protruding portions of the glass. This process may enable new and varied techniques for forming openings in monolithic glass sheets. For example, multiple openings, even openings of different sizes and shapes (such as the openings 120, 140 in FIGS. 1-2) can be formed simultaneously by applying a flat grinding tool to the shaped glass sheet. By contrast, with other cutting and machining processes (such as directing a laser perpendicularly onto a glass sheet or using an end mill that is perpendicular to the glass sheet) it may be difficult to machine or cut multiple openings having different sizes or shapes in an efficient manner. For example, it may be difficult to position all of the necessary tooling adjacent the glass sheet at the same time, thus mandating slower processes such as forming the openings serially.

Figure 6A:
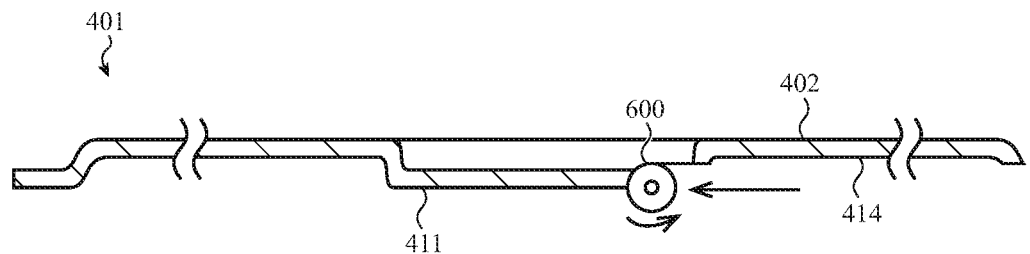
FIG. 6A shows a partial cross-sectional view of a shaped glass sheet, viewed along line 4B-4B in FIG. 4A, showing the glass sheet during a material removal operation.

FIG. 6A shows a partial cross-sectional view of the shaped glass sheet 401, viewed along line 4B-4B in FIG. 4A, during a machining operation to remove at least some of the high relief portion 411 and (optionally) the border portion 412. In particular, FIG. 6A shows a rotating tool 600, such as a grinding wheel or milling bit, removing part of the high relief portion 411 to form the opening (e.g., the second opening 506, FIG. 5) in the shaped glass sheet 401 and thereby form the perforated glass sheet 502 (FIG. 5). While FIG. 6A shows a rotating tool, other cutting tools are also contemplated, such as wire saws.

The tool 600 may be configured to only contact the high relief portion 411, and not to make contact with the low relief portion 414, thereby avoiding scratches and/or tool marks on the low relief portion 414. For covers where the low relief portion 414 covers a display, this may help preserve the transparency and optical properties of the low relief portion 414. Moreover, the tool 600 may form the opening 506 without contacting an inner surface 603 (FIGS. 6B-6C) of the opening 506. For example, a typical drilling or milling operation may form an opening by penetrating through the sheet substantially perpendicularly to the surfaces of the sheet, thus machining the inner surface 603 by contacting the inner surface 603 with the tool. On the other hand, the shape and configuration of the high relief portion 411 allows the opening 506 to be formed without having to machine the sidewalls (e.g., the inner surface 603) of the opening 506 directly. When this technique is applied to forming a cover for an electronic device, as described herein, the machined surface is positioned out of view and out of reach of a user of the electronic device (e.g., it faces and/or is oriented towards an interior portion of the electronic device, and is not reachable by a user under normal operation of the device). This may reduce the processing steps required to produce a desired shape and surface finish for the inner surface 603 of the opening 506, as the additional processing steps to turn the raw machined surface into a suitable final form (e.g., grinding, machining, polishing, buffing) may be reduced or omitted.

Figure 6B:
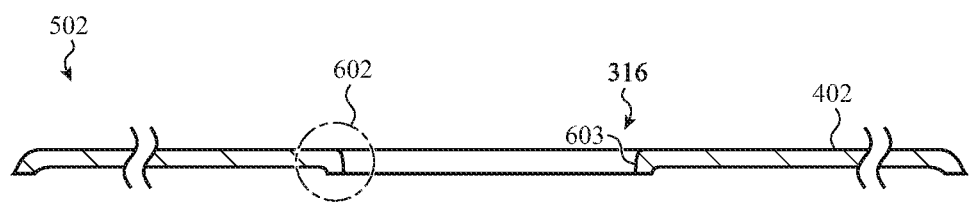
FIG. 6B shows a partial cross-sectional view of a glass sheet, viewed along line 6B-6B in FIG. 5.

FIG. 6B shows a partial cross-sectional view of the perforated glass sheet 502, viewed along line 6B-6B in FIG. 5. As shown, the high relief portion 411 (FIG. 6A) and the border portion 412 (FIGS. 4A-4B) have been removed from the shaped glass sheet 401 to form the perforated glass sheet 502 defining the opening 506. In some cases, high relief portions corresponding to other openings may be removed at substantially the same time as the high relief portion 411 (e.g., simultaneously). For example, the tool 600 may be configured to contact all of the high relief areas of a shaped glass sheet at substantially the same time. In one example, the tool 600 is a grinding wheel with a substantially flat or planar axial side that is large enough to substantially simultaneously contact all of the high relief surfaces of a shaped glass sheet. One or more shaped glass sheets (e.g., the shaped glass sheet 401) may be placed in contact with the axial side of the grinding wheel until the high relief portions (e.g., the high relief portions 411 and the border portion 412, and any other high relief portions, such as one corresponding to the first recess 408) are removed and the openings are formed.

Figure 6C:
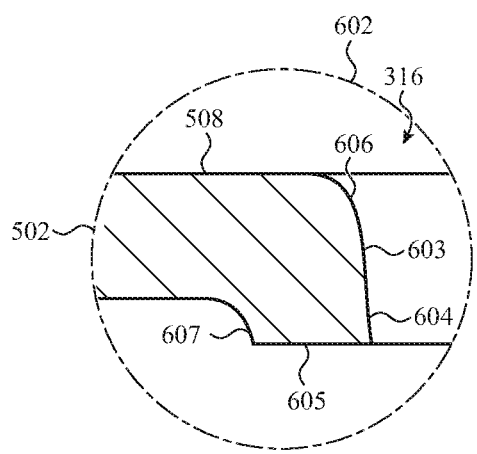
FIG. 6C is a detail view of a portion of the glass sheet in FIG. 6B.

In some cases, the high relief portions are not entirely removed from the shaped glass sheet 401 such that part of the material that defined the high relief portions is left extending from the bottom surface of the perforated glass sheet 502. FIG. 6C is a detail view of the area 602 in FIG. 6B, illustrating the shape of the opening 506, where the opening 506 includes some of the unremoved material from the high-relief portion.

In particular, the recesses may be at least partially defined by joining segments 407 (FIG. 4B) that join the bottom or recessed portion of the recess to the main portion of the sheet 401. Returning to FIG. 6C, a portion of the joining segment 407 (FIG. 4B) that was not fully removed from the perforated glass sheet 502 forms a wall 604 (which may extend a distance relative to the bottom surface of the glass) that surrounds and extends from the opening 506. The glass sheet 502 may be a monolithic component that includes the wall 604 (and optionally other walls) as well as the substantially planar portions.

The wall 604 defines an interior surface of the opening 506. That is, the interior surface (or sidewall) of the opening 506 may define at least part of an inner surface 603 of the wall 604, and an outer or exterior surface 607 of the wall may extend at an angle to the bottom surface of the glass sheet 502 (e.g., the outer surface of the wall may extend substantially perpendicularly from the bottom surface). The wall 604 also defines a top surface 605. The top surface 605 may be a machined or ground surface, as a result of the removal of the high relief portion 411. A machined or ground surface may have grooves, channels, cracks, ridges, or other patterns or features formed into the surface as a result of a machining or grinding operation (or any other physical ablation or removal operation). These features or patterns may be substantially regular or repeating, as may occur during a grinding or machining or other physical ablation operation (e.g., when a rotating grinding wheel or oscillating cutting tool is used to cut the material).

The wall 604 may increase the strength and/or rigidity of the perforated glass sheet 502, particularly in the area of the opening 506. In particular, the wall 604 acts as a stiffening member by increasing the size and/or the second moment of inertia of the perforated glass sheet 502 in the areas of the opening 506. Similar walls may be formed around any of the apertures or openings that are formed using the described processes. For example, a wall similar to the wall 604 may surround the opening 504 (FIG. 5).

In addition to strengthening and/or stiffening the sheet 502, the walls (e.g., the wall 604) around the openings may also make the glass appear thicker than its actual thickness. For example, because the walls defining the openings extend at an angle from a primary surface of the glass sheet (e.g., the glass sheet curves downward around the edge of the opening 506, as shown in FIG. 6C), the height of the walls (e.g., the length of the surface that defines the inner surface of the opening) may be greater than the thickness of the sheet itself. Accordingly, when an opening is viewed so that the walls are visible, the walls may give the appearance that the glass sheet has a thickness corresponding to the height of the walls, rather than the actual thickness of the glass sheet.

Also, the slumping process may produce smooth, rounded contours at the edges of the openings without requiring additional machining or polishing processes to form the smooth, rounded contours. For example, when the glass conforms to a recess or a protrusion in a mold, the surface of the glass that is opposite the mold (e.g., that does not contact the mold) may form substantially continuous, rounded edges where the glass relaxes around the mold contours. For example, FIG. 6C shows a continuous, rounded edge surface 606 extending between a top surface of 508 of the sheet 502 and the portion of the sheet 502 defining the wall 604. These rounded edges may be smoother to the touch, thereby providing a more desirable tactile sensation when a user contacts the edges of the openings (e.g., when pressing the button cover 130 to actuate the button input, or when the user places the device 100 to an ear, thus placing the opening 140 near or on the user's ear). Additionally, the interior and exterior surfaces 603, 607 of the wall 604 may be formed and shaped during the molding or slumping process, and thus may not require additional machining or grinding or other bulk material removal processes. In some cases, they may not even require polishing, as the unmachined surfaces may be sufficiently smooth after the molding or slumping process.

Because the rounded edges are formed during the slumping process rather than by a machining or grinding operation, the resulting perforated glass sheet 502 may be stronger and/or more durable than perforated sheets formed via other processes. For example, while a rounded edge may be produced by milling, grinding, drilling, or other machining or ablation techniques, these processes may produce cracks (e.g., micro-cracks) or other surface irregularities that act as stress concentration points where larger cracks may initiate. By forming the rounded edges with a slumping operation (or another operation where the glass is allowed to relax and naturally form its outer surface), the rounded or contoured edges may be formed without cracks or other stress concentrators.

Regardless of whether the edges of the openings are rounded or contoured, or whether they are defined by discontinuous edges (e.g., right angle edges or corners), the slumping process may produce edges that do not require additional machining to form the edges. Thus, the edge, and indeed the entire inner surface of the opening may be unmachined. For example, the edge and the inner surface may not be milled or drilled to form the opening or to finish the surface. Where the edge and/or inner surface are formed without machining, they may be polished or buffed to produce a desired surface finish. Even in these cases, however, the machining operation that forms the openings may not require or result in contact between the machining tool and the edge or the inner surface.

Figure 7A:
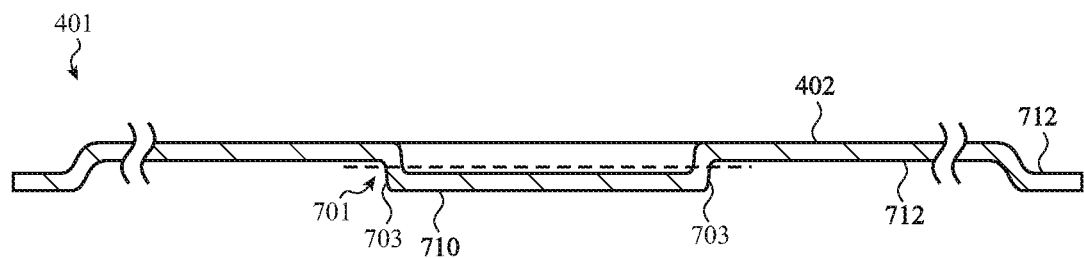
FIG. 7A shows a partial cross-sectional view of a shaped glass sheet, viewed along line 7A-7A in FIG. 4A.
Figure 7B:
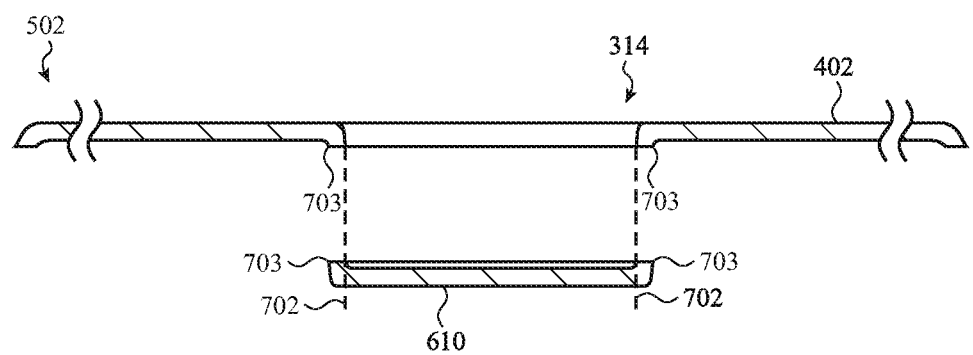
FIGS. 7B-7C show partial cross-sectional views of a glass sheet, viewed along line 7B-7B in FIG. 5.
Figure 7C:
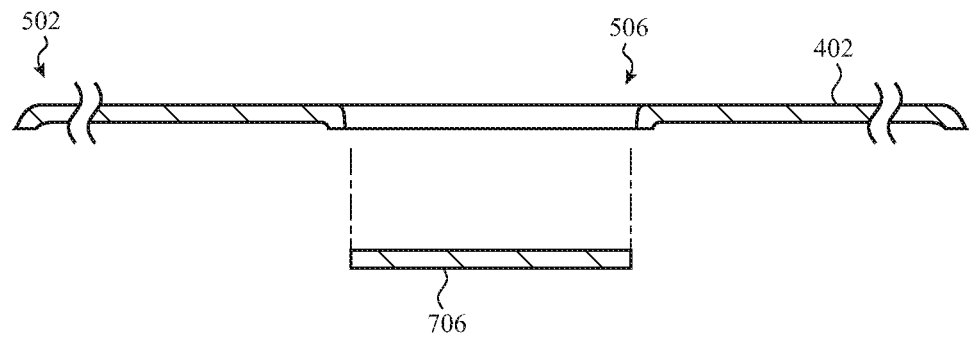

The operation of removing the high relief portions described above with respect to FIGS. 6A-6B results in the destruction of the high relief portions of the shaped glass sheet. In some cases, a high relief portion of a shaped glass sheet may itself be useful as a cover for an electronic device or a component thereof. For example, when removing a recessed portion of a shaped glass sheet to form an opening for a button (such as the opening 506, FIG. 5), the removed portion of the sheet may be used as a cover for the button. In such cases, a high relief portion of a shaped glass sheet may be removed in a nondestructive process. FIG. 7A shows a partial cross-sectional view of the shaped glass sheet 401, viewed along line 7A-7A in FIG. 4A, illustrating the sheet 401 at various stages of a process of removing a recessed portion of the sheet 401. FIGS. 7B-7C show partial cross-sectional views of the perforated glass sheet 502, viewed along line 7B-7B in FIG. 5, illustrating the perforated sheet 502 after removal of a recessed portion of the shaped glass sheet 401. The result of the process shown in these figures is a first cover with an opening (such as the cover 110, FIG. 1) and a second cover corresponding to the portion that was removed to form the opening (such as the button cover 130, FIG. 1).

FIG. 7A shows the shaped glass sheet 401 with a cut line 701 extending through joining portions 703 that join a high relief portion 710 to a low relief portion 712. FIG. 7B shows the shaped glass sheet 401 after the high relief portion 710 has been separated from the shaped glass sheet 401 along the cut line 701. The high relief portion 710 may be separated or singulated from the shaped glass sheet 401 in any suitable way, such as with a laser beam, electron beam, water jet, wire saw, cutting tool, or the like. For example, a laser beam may be directed onto the joining portions 703 from the side (e.g., substantially perpendicular to the joining portions 703 and/or substantially parallel with the low relief portion 712, though other angles are also contemplated).

After removal, the high relief portion 710 may be further processed, such as by removing the outer edges of the high relief portion 710 (e.g., the portions of the joining portions 703 that remained attached to the high relief portion 710). For example, FIG. 7B shows cut lines 702 where the high relief portion 710 may be cut to remove the joining portions 703. The joining portions 703 may be removed from the high relief portion 710 in any suitable way, such as with a laser beam, electron beam, water jet, machining tool, or the like.

The high relief portion 710 may be shaped so that it fits in the opening 506 that was created by the removal of the high relief portion 710. For example, where the opening 506 is adjacent or overlies an input device (e.g., the input device 204, FIG. 2A), the high relief portion 710 may be used to form a cover for the input device that fits within the opening 506 (e.g., the button cover 130, FIGS. 1-2). FIG. 7C shows a cover 706 that is formed from the high relief portion 710 and is configured to fit within the opening 506. Thus, when the perforated glass sheet 502 is coupled to a housing and the cover 706 is coupled to an input device, the cover 706 may be positioned within the opening 506. The cover 110 and the button cover 130 of FIGS. 1-2 may correspond to the perforated glass sheet 502 and the cover 706 described with respect to FIG. 7C. In some cases, instead of using the glass from the aperture to use as a button cover inside the aperture, the button cover 130 may be formed from a separate sheet than the cover 110. For example, FIGS. 9-20C show an example in which multiple button covers are formed on a single sheet, where the remaining portion of the sheet is not used as a cover for an electronic device.

Figure 8A:
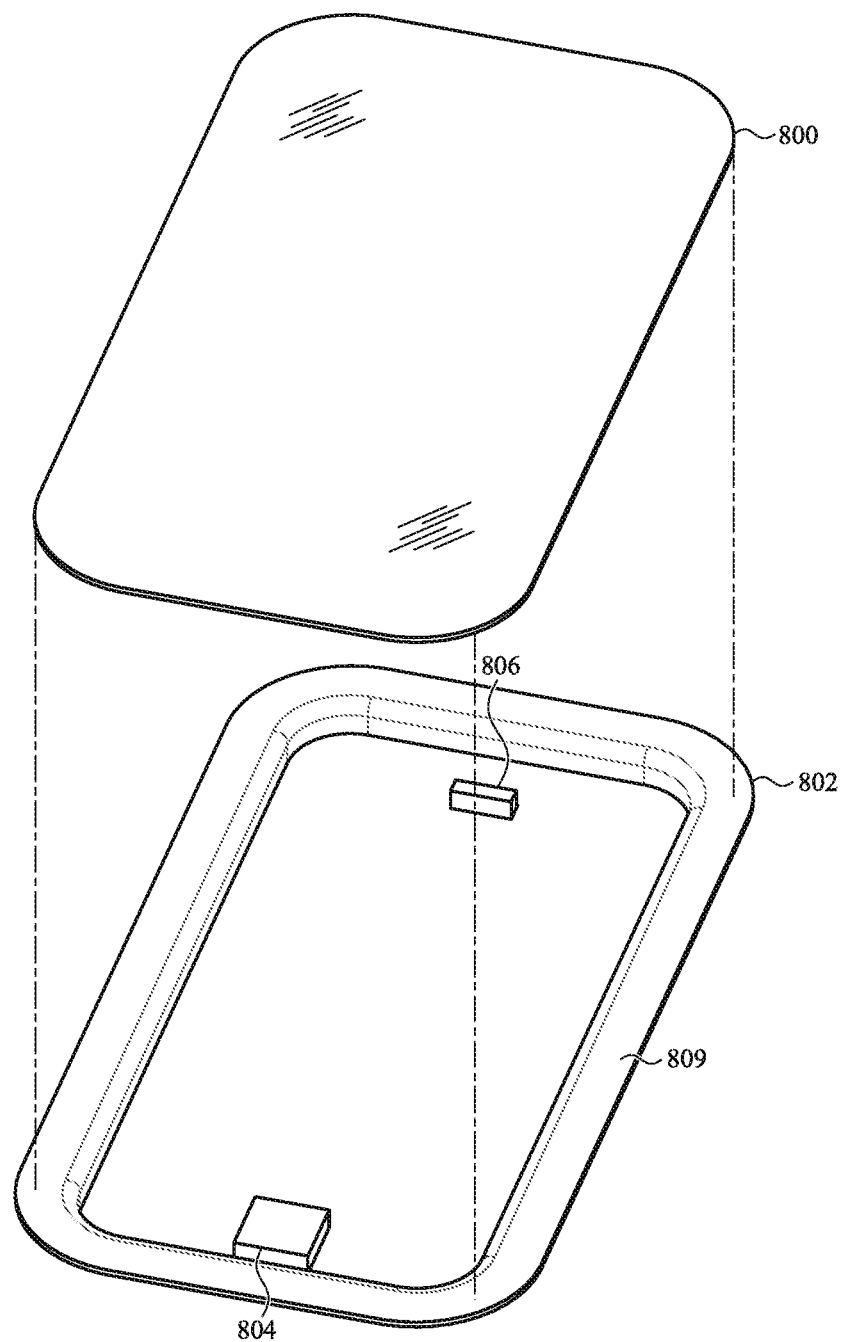
FIGS. 8A-8B show another example process for forming a glass cover.
Figure 8B:
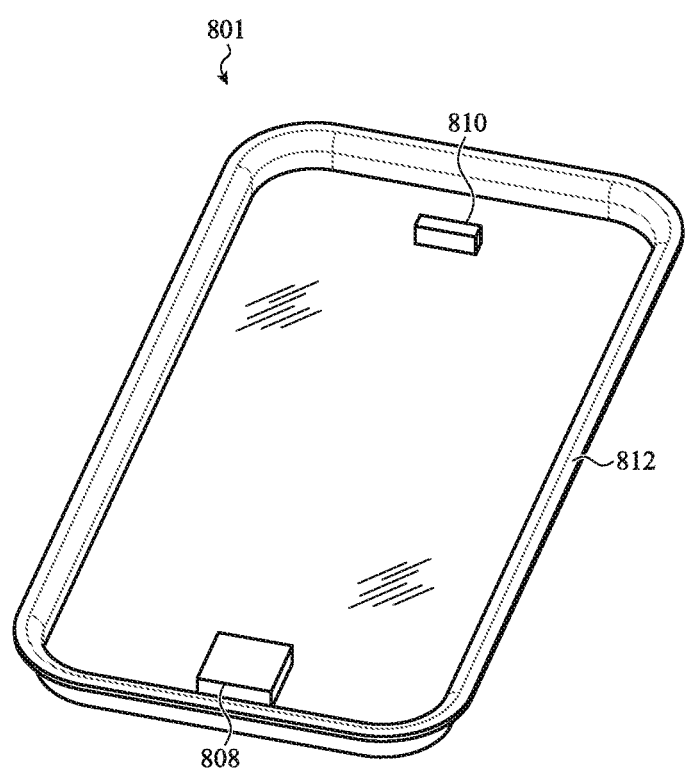

FIGS. 3-5 describe forming a contoured glass sheet by allowing the glass sheet to relax into a mold with recesses that correspond to recesses to be formed in the glass sheet. However, recesses may also be formed using a mold that has protrusions, where the protrusions form the recesses in the glass sheet (e.g., the glass sheet relaxes around the protrusion of the mold). FIGS. 8A-8B illustrate an example process for forming a glass cover, such as the cover 110, for an electronic device, where the recesses in the glass are formed by mold protrusions, rather than mold recesses.

FIG. 8A shows a glass sheet 800 positioned over a shaped mold 802. As shown, the glass sheet 800 is substantially planar and has a substantially uniform thickness. The shaped mold 802 includes a first protrusion 804 and a second protrusion 806. The first protrusion 804 may be configured to produce a recess or indentation in the glass sheet 800 that will ultimately be removed to form an aperture or opening (e.g., the opening 120, FIGS. 1-2) for a button cover, while the second protrusion 806 may be configured to produce a recess or indentation in the glass sheet 800 that will ultimately be removed to form an opening for a speaker or other audio component (e.g., the speaker 206, FIG. 2A). The shaped mold 802 may also have a flange region 809 that forms a flange or border region on the glass sheet 800. Thus, the shaped mold 802 may form a shaped glass sheet 801 (FIG. 8B) that has the same or similar shape as the shaped glass sheet 401 formed by the shaped mold 302.

The shaped glass sheet 801 may be further processed to remove at least part of the recesses 808, 810 to form openings, such as the openings 506, 504 (FIG. 5) in the shaped glass sheet 801. For example, the recesses may be machined, ground, cut, or otherwise removed from the remaining portion of the shaped glass sheet 801, as described with respect to FIGS. 6A-7C (or in any other suitable manner).

The forming process described with respect to FIGS. 3-5 may be used to produce a cover where the exterior or interface surface was not in contact with the shaped mold 302 during a molding or slumping operation. On the other hand, the exterior surface of a cover formed by the process described with respect to FIGS. 8A-8B may have been in contact with the surface of the mold 802. In the latter case, the surface of the mold 802 that contacts the glass to form the exterior surface of the cover may have a particular surface polish, finish, or texture that will be replicated on the exterior surface of the cover.

FIGS. 3-8B illustrate recesses and openings having particular shapes. For example, the first recesses 408, 808 (and the corresponding openings) and the second recesses 410, 810 (and the corresponding openings) are substantially rectangular. These are merely example shapes, however, and other shapes are also contemplated for the openings in a perforated glass sheet and for the covers optionally formed by removing high relief portions from the sheets, such as circles, rectangles, rounded rectangles, ovals, pill- or lozenge-shapes, oblong shapes, or the like.

As described above with respect to FIGS. 7A-7C button covers may be formed from a piece of glass that was removed from a larger piece of glass when forming an aperture in the larger glass, where the aperture itself surrounds or is aligned with the button or other input device. In other cases, button covers (or covers for other types of input devices) may be formed from a different sheet than the sheet that is used for the cover, or they may be used in devices without a glass cover. For example, multiple button covers may be formed on a single sheet, and the button covers may be singulated from the sheet. The button covers may be used to cover or couple to input devices, while the remaining portion of the sheet may be discarded, or may be destroyed as a result of the singulation and/or further processing of each button cover. FIGS. 9-20C show various techniques for forming button covers in this way. Of course, any of the described techniques may be used separately or in conjunction with other techniques, processes, or methods described herein.

Figure 9:
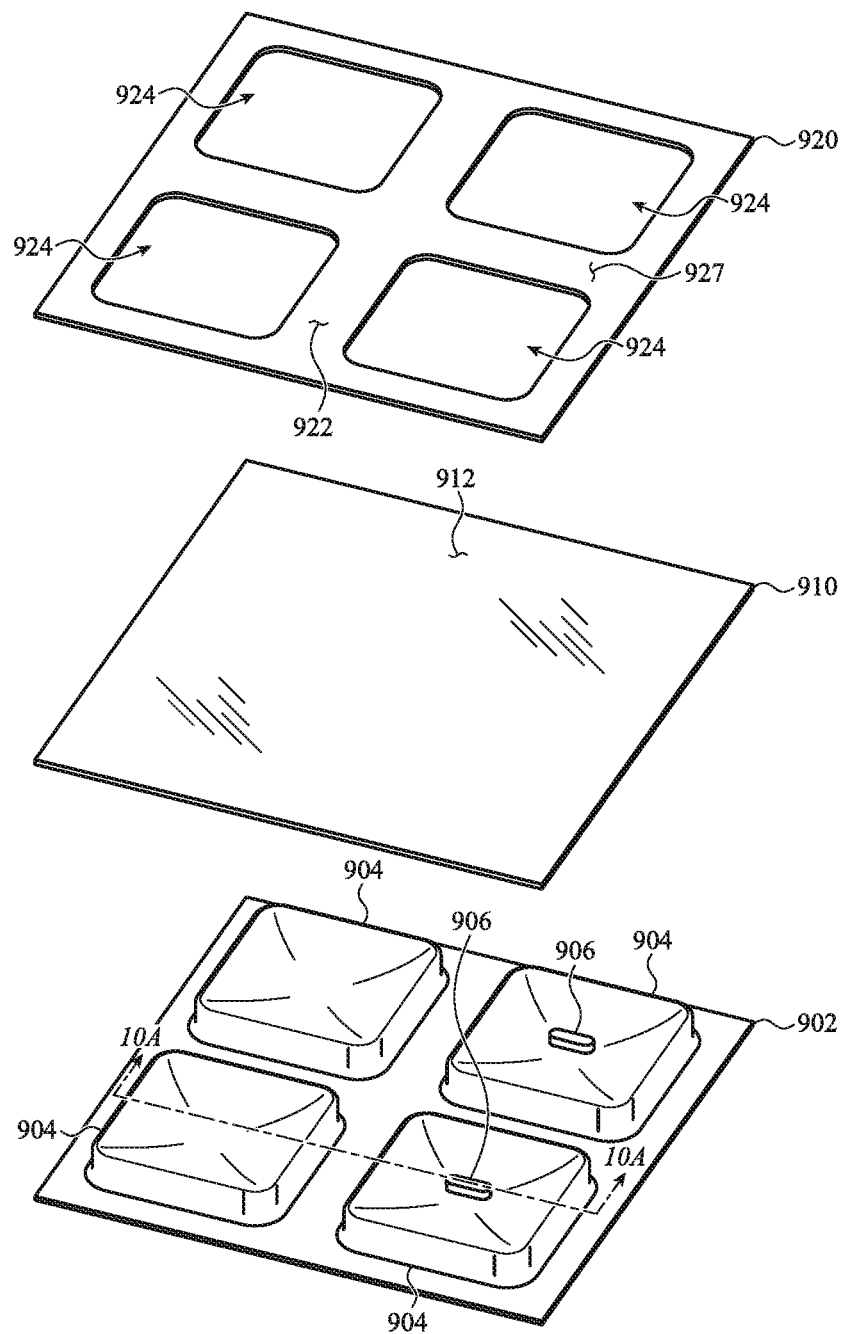
FIG. 9 shows a perspective view of an example molding apparatus.

FIG. 9 illustrates an example molding apparatus that may be used to form a single sheet having multiple protrusions from which multiple glass button covers may be produced. For example, a shaped mold 902 may include a plurality of protrusions 904. When a glass sheet 910 is molded or slumped against the shaped mold 902, the protrusions 904 may produce corresponding protrusions in the glass sheet 910. These protrusions may be removed from the remaining portion of the glass sheet 910, as described herein, and used as covers for buttons or other input devices (such as the button cover 130, FIG. 1).

The protrusions 904 of the shaped mold 902 may be configured to produce button or input device covers of any particular shape, and with any particular features. For example, the top surfaces of the protrusions 904 may be concave, such that the corresponding features molded into the glass sheet 910 may also be concave. As another example, if the top surfaces of the protrusions 904 are substantially flat or planar, the corresponding features molded into the glass sheet 910 may also be substantially flat or planar. As shown in FIG. 9, the top surface of the glass sheet 910 (e.g., the surface that is not against the shaped mold 902 during molding) may form the exterior or user-facing surfaces of the glass button covers. Thus, a concave top surface of the protrusions 904 will produce a concave user-facing surface in the corresponding glass button cover. The shaped mold 902 may form such features in the glass sheet 910 by contacting substantially the entire bottom surface of the glass sheet 910, thereby transferring the shape of the shaped mold 902 to the glass sheet 910.

As noted above, in some cases a glass button cover may optionally include a raised feature 121 (FIG. 1). In such cases, the protrusions 904 may have mold features 906 that are configured to form a raised feature in the glass sheet 910 (and ultimately to form the raised feature of a button cover). FIG. 9 shows some protrusions 904 that lack the mold features 906, and others that include the mold features 906. In other examples, the protrusions 904 may all have the mold features 906 (e.g., all button covers produced therefrom will have the raised features), or they may all exclude the mold features 906 (e.g., no button covers produced therefrom will have the raised features).

The molding apparatus shown in FIG. 9 may also include a top mold 920. The top mold 920 may be used to apply pressure to the glass sheet 910 during the molding process. As shown, the top mold 920 may be a partial mold that includes web portions 922 defining openings 924. The web portions 922 may be aligned with the recessed areas between the protrusions 904 of the shaped mold 902, and may force portions of the glass sheet 910 into the recessed areas during molding. This process, depicted in greater detail in FIGS. 10A-10C, may help mold the glass sheet 910 onto and around the protrusions 904, thereby producing more consistent shapes and helping force the glass sheet 910 into intimate contact with the shaped mold 902.

Further, the webbed design of the partial top mold 920 increases the molding pressure between the glass sheet 910 and the shaped mold 902 without contacting the top surface 912 on the portions that form the top or user-facing surfaces of the button covers. This may help avoid imparting any textures or imperfections, which may be present in a top mold, into the user-facing surface of the button covers. This may also help maintain a desired structural or cosmetic surface on the button covers, and reduce or eliminate other processing steps such as polishing or machining that may otherwise be required to remove textures or other remnants of a top mold.

While FIG. 9 shows a molding apparatus that will produce a sheet with a 2×2 grid or array of button covers, this is merely exemplary, and the molding apparatus may instead be configured to produce sheets with more button covers, such as a 3×3 grid, 4×4 grid, 5×5 grid, or any other arrangement or quantity of button covers.

Figure 10A:
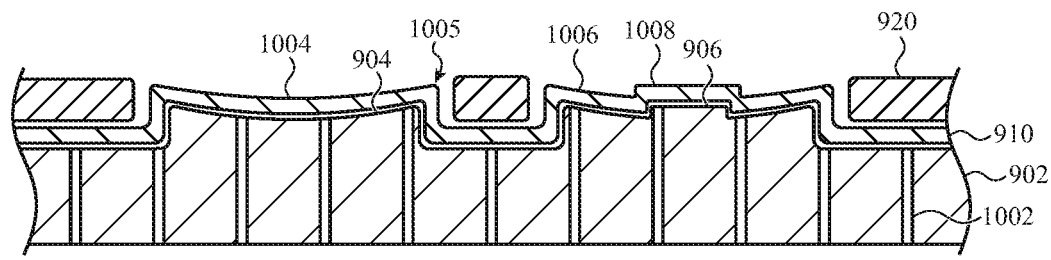
FIGS. 10A-10C show partial cross-sectional views of the molding apparatus of FIG. 9.

FIG. 10A depicts a cross-sectional view of the molding apparatus of FIG. 9, viewed along line 10A-10A in FIG. 9. FIG. 10A shows how the shaped mold 902 and the top mold 920 cooperate to mold protrusions 1004, 1006 into the glass sheet 910. For example, the top mold 920 may contact the glass sheet 902 in a region between the protrusions 904 of the shaped mold 902 (e.g., it may contact what becomes a web portion of the glass sheet). The pressure of the top mold 920 on the web portion of the glass sheet 910 may help pull the glass sheet 910 against the shaped mold 902, thus increasing the quality of the replication of the shape of the shaped mold 902 in the glass sheet 910.

Further, while the top mold 920 does not contact the entire top surface of the glass sheet 910, the top mold 920 (e.g., the web portions 922 of the top mold) effectively increases the tension in the glass sheet 910, which helps draw the glass sheet 910 into close contact with the top and side surfaces of the protrusions 904. This additional force or tension may also help form consistent corner features or shapes in the glass sheet 910. For example, the additional force and stretching caused by the top mold 920 (as compared to a slumping or molding process without a top mold) may cause an edge region 1005 of the glass sheet 910 to form a target radius, spline, or other contour, even without any mold surface actually contacting the exterior or top surface of the edge region 1005.

As noted above, the protrusions 906 are configured to form raised features 1008 in the glass sheet 910. The additional force provided by the top mold 920 may also increase the quality or consistency of replication of the protrusions 906 in the glass sheet 910, as the glass sheet 910 may be forced to more intimately contact the protrusions 906 and thus form a more distinct raised features 1008 (as compared to a slumping or molding process without a top mold, for example).

The top mold 920 thus may increase the quality of replication of the shaped mold's features into the glass sheet 910. Because the top mold 920 does not contact the external (e.g., top) surface of the protrusions 1004, 1006, these surfaces may avoid being marred, shaped, textured, or otherwise affected by a mold surface. Further, because the glass sheet 910 is heated during the molding process, the absence of a top mold in contact with these surfaces may allow these surfaces to form smooth, continuous surfaces. These surfaces may require less post-processing (e.g., grinding, machining, lapping, polishing) to achieve a desired surface finish than molding processes that directly contact the surfaces. In some cases, the surface may be sufficiently smooth after the molding process that no further polishing of the user-facing surfaces (e.g., top, side, and edge surfaces) is necessary prior to a button cover being integrated with an input device or electronic device.

In some cases, the shaped mold 910 may also include vacuum lines 1002 in the mold 910. Together with a vacuum source, the vacuum lines 1002 may draw the glass sheet 910 against the molding surface of the shaped mold 910 to conform the glass sheet 910 to the features of the shaped mold 910. In some cases, the area above the glass sheet 910 may be pressurized to produce a greater pressure differential on the opposite sides of the glass sheet 910. In such cases, the vacuum source may be omitted or used in conjunction with pressurization on the top surface of the glass sheet 910. For example, any pressure differential between the top and bottom surfaces of the glass sheet 910 may force the glass sheet 910 against the molding surface of the shaped mold 910.

As described above, the glass sheet 910 may be heated prior to being molded by the shaped mold 902 and the top mold 920. For example, the glass sheet 910 may be heated (e.g., in a furnace, by flame, or any other suitable technique) and then placed on the shaped mold 902 and subjected to molding forces (e.g., by gravity, vacuum, pressure differential, the top mold 920, etc.) to produce a shaped glass sheet.

Figure 10B:
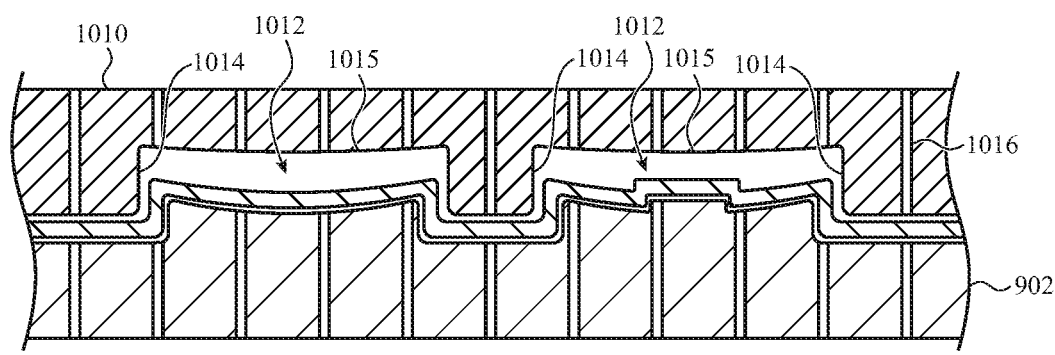

FIG. 10B depicts a cross-sectional view of another molding apparatus, similar to that shown in FIG. 9. Instead of a top mold with a web configuration and openings that correspond to the mold protrusions 904, the top mold 1010 in FIG. 10B forms an enclosed mold cavity. For example, the top mold 1010 includes protrusions 1014, which provide the same or similar functions as the web portions 922 of the top mold 920, as described above. The top mold 1010 also includes top walls 1015 spanning the areas between the web portions 922 and defining an enclosed mold cavity. The top walls 1015 may be recessed relative to the protrusions 1014 such that the top walls 1015 do not contact the glass sheet 910 during the molding process, instead leaving a space 1012 above the glass sheet 910. As such, while the top mold 1010 fully encloses or covers the glass sheet 910 (or at least the portions of the glass sheet 910 that are being formed to produce the button covers). This may allow for greater pressure control inside the mold during molding. For example, the top mold 1010 may include air lines 1016, which may be used to increase (or decrease) the pressure on the top side of the glass sheet 910 to produce a pressure differential on the opposing sides of the glass sheet 910 to force the glass sheet 910 into intimate contact with the shaped mold 902.

Figure 10C:
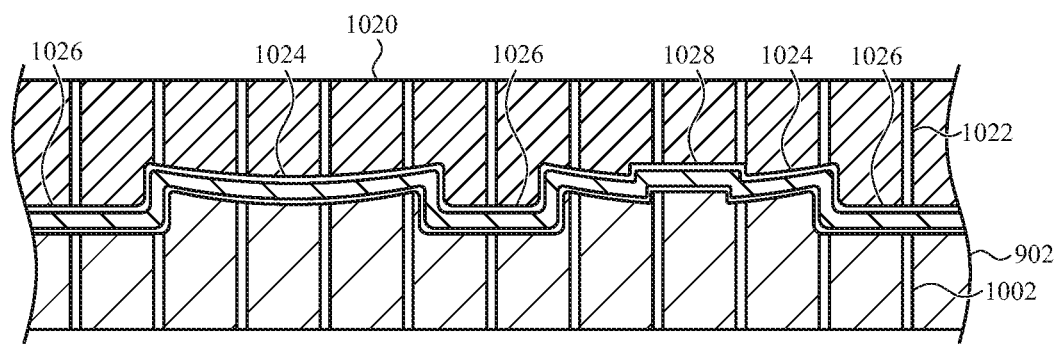

FIG. 10C depicts a cross-sectional view of another molding apparatus, similar to that shown in FIG. 9, but with a top mold 1020 that is configured to substantially completely contact the glass sheet 910 during molding. For example, the top mold 1020 may be complementary to the shaped mold 902, having web portions 1026 and recessed portions 1024 that both contact the top surface of the glass sheet 910 during molding. The top mold 1020 also includes a complementary recess 1028, corresponding to the protrusion 906, to help form a raised feature on the glass sheet 910 (e.g., corresponding to the raised feature 121, FIG. 1).

The top mold 1020 may be used in cases where it is desired to impart a shape or texture to the top surface of the glass sheet 910 that is not achieved with natural slumping or relaxation of the glass sheet 910 over the shaped mold 902. For example, without a directly opposing mold surface, the top surface of the glass sheet 910 may not exactly replicate the protrusion 906. Accordingly, the resulting raised feature may not be adequately distinguished from the adjacent portions of the top surface of the glass sheet 910. Accordingly, a top mold 1020 may be used to impart a desired shape to the raised feature, as well as any other portion of the glass sheet 910.

As another example, it may be desirable to use the top mold 1020 to impart a particular texture or surface finish to the top surface of the glass sheet 910. For example, the mold surfaces of the top mold 1020 may be shaped or textured, and those shapes or textures may be imparted to the glass sheet 910. The textures or shapes may include ridges, pebbling, bumps, or any other suitable texture. Because the top surface of the glass sheet 910 (as depicted in FIG. 10C) may form an exterior or user-facing surface of an input device, the texturing or surface finish may be used to form a consistent tactile feel across different input devices on a given electronic device, as well as across input devices of different electronic devices (e.g., so that each smartphone from a particular manufacturer, for example, has a consistent look and feel).

Figure 11:
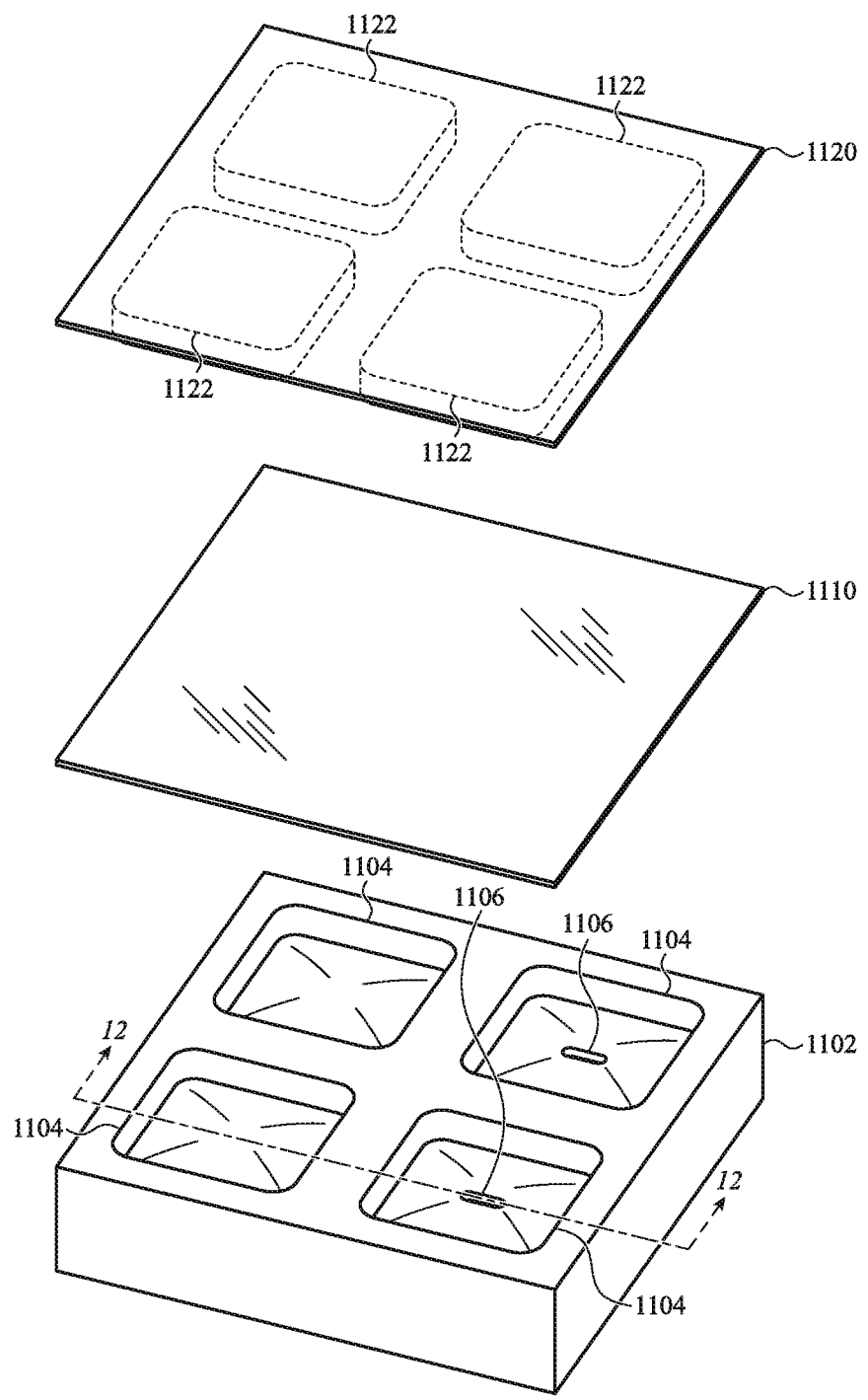
FIG. 11 shows a perspective view of another example molding apparatus.

FIG. 11 shows another example molding apparatus that may be used to form shaped glass sheets from which multiple button covers may be produced. As shown in FIG. 11, a shaped mold 1102 may include a plurality of recesses 1104, each configured to produce a protrusion on the glass sheet 1110 that will ultimately be formed into a button cover. Thus, the surface of the glass sheet that ultimately becomes the exterior or user-facing surface of the button covers faces is in contact with recesses in the shaped mold 1102, rather than facing upward and being uncontacted by a mold surface (as described with respect to FIGS. 10A-10B, for example).

The recesses 1104 of the shaped mold 1102 may be configured to produce button covers of any particular shape, and with any particular features. For example, the bottom surfaces of the recesses 1104 may be convex, such that the corresponding features molded into the glass sheet 1110 may be concave (once the features are singulated and formed into button covers). As another example, if the bottom surfaces of the recesses 1104 are substantially flat or planar, the corresponding features molded into the glass sheet 1110 may also be substantially flat or planar.

As noted above, in some cases a button cover may optionally include a raised feature 121 (FIG. 1). In such cases, the recesses 1104 may have mold features 1106 (e.g., recesses in the bottom surface that defines the recess 1104) that are configured to form a raised feature in the glass sheet 1110 (and ultimately to form the raised feature of a button cover). FIG. 11 shows some recesses 1104 that lack the mold features 1106, and others that include the mold features 1106. In other examples, the recesses 1104 may all have the mold features 1106 (e.g., all button covers produced therefrom have the raised features), or they may all exclude the mold features 1106 (e.g., no button covers produced therefrom have the raised features).

The molding apparatus shown in FIG. 11 may optionally include a top mold 1120. The top mold 1120 may be used to apply pressure to the glass sheet 1110 during the molding process. As shown, the top mold 1120 has protrusions 1122 that correspond to and/or are aligned with the recesses 1104 in the shaped mold 1102. The protrusions 1122 may be configured to force portions of the glass sheet 1110 into the recesses 1104 during molding. This process, depicted in greater detail in FIG. 11, may help mold the glass sheet 1110 into the recesses 1104, thereby producing more consistent shapes and helping force the glass sheet 1110 into intimate contact with the shaped mold 1102. In some cases, however, the top mold 1120 may be omitted, and the glass sheet 1110 may be allowed to relax and slump against the shaped mold 1102 and into the recesses 1104 either without additional force (e.g., using only gravity), or using only fluid pressure differential (e.g., a vacuum system in the shaped mold 1102 and/or increased pressure on the opposite side of the mold).

While FIG. 11 shows a molding apparatus that will produce a sheet with a 2×2 grid or array of button covers, this is merely exemplary, and the molding apparatus may instead be configured to produce sheets with more button covers, such as a 3×3 grid, 4×4 grid, 5×5 grid, or any other arrangement or quantity of button covers.

Figure 12:
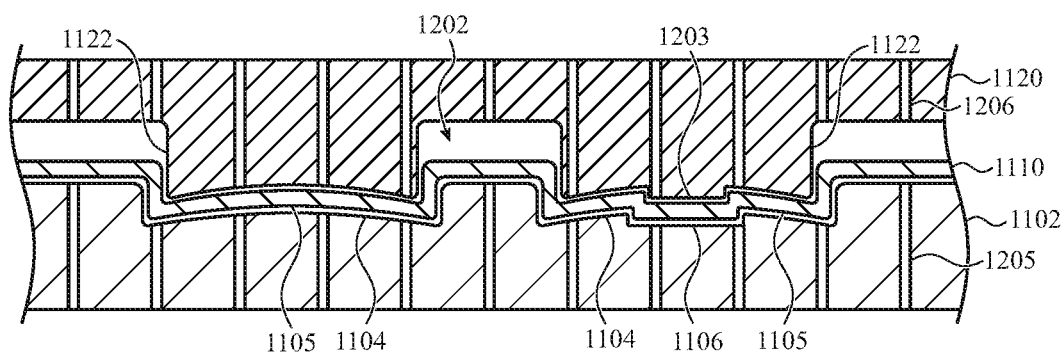
FIG. 12 shows a partial cross-sectional view of the molding apparatus of FIG. 11.

FIG. 12 depicts a cross-sectional view of the molding apparatus of FIG. 11, viewed along line 12-12 in FIG. 11. FIG. 12 shows how the shaped mold 1102 and the top mold 1120 cooperate to mold protrusions 1105 into the glass sheet 1110. The protrusions 1105 may appear as recesses in FIG. 12 because the glass sheet 1110 is essentially being molded upside down as compared to FIGS. 9-10C, for example. Nevertheless, for consistency in the description and because the bottom surface of the glass sheet 1110, as shown in FIG. 12, forms the exterior, user facing surfaces of the button covers (e.g., the top and side surfaces), the protrusions 1105 are referred to herein as protrusions instead of recesses.

FIG. 12 shows the protrusions 1122 of the top mold 1120 in contact with the glass sheet 1110, forcing the glass sheet 1110 into intimate contact with the recesses 1104 of the shaped mold 1102. In cases where raised features are to be formed in the glass sheet 1110, the protrusions 1122 may include complementary protrusions (e.g., the protrusion 1203) that force the glass into the recess 1106 that forms the raised feature.

As shown, the top mold 1120 may be configured so that parts of the mold do not contact the glass sheet 1110. For example, the top mold 1120 may include recesses or channels that form spaces 1202 above the glass sheet 1110 during molding. The spaces 1202 between the protrusions 1122 may reduce the strain or force on the glass sheet 1110 during molding.

In order to assist in shaping the glass sheet 1110, the shaped mold 1102 and the top mold 1120 may include vacuum lines 1205, 1206, respectively. The vacuum lines 1205, 1206 may be used to increase or decrease a fluid pressure on the glass sheet 1110 to help force the sheet 1110 into contact with desired portions and/or surfaces of the molds.

While FIG. 12 shows the shaped mold 1102 being used in conjunction with a particular top mold 1120, other configurations of top molds may also be used. For example, a top mold that substantially entirely contacts the top surface of the glass sheet 1110 may be used. In other cases, the top mold may be omitted altogether.

Figure 13A:
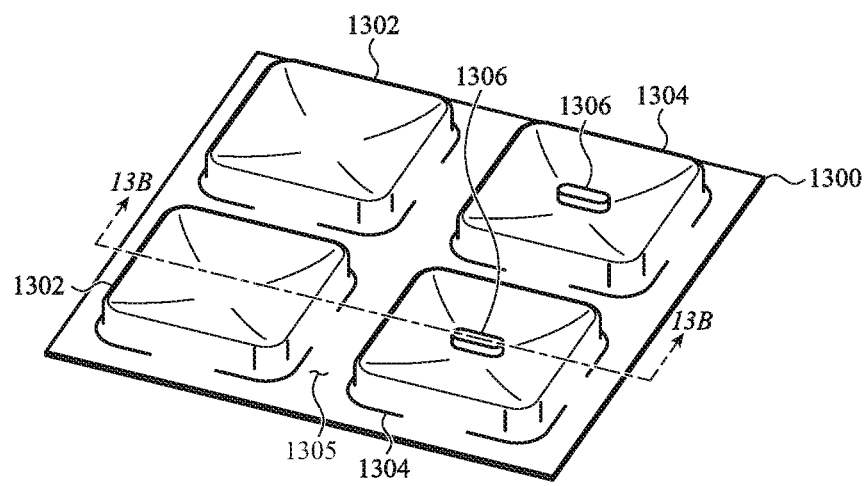
FIG. 13A shows a perspective view of a shaped glass sheet.
Figure 13B:
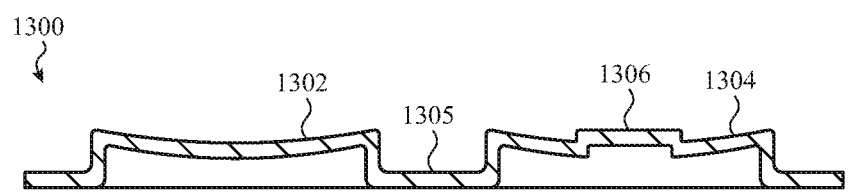
FIG. 13B shows a cross-sectional view of the shaped glass sheet of FIG. 13A.

FIGS. 13A-13B illustrate a shaped glass sheet 1300 that may result from molding a glass sheet using the apparatuses and techniques described with respect to FIGS. 9-12. FIG. 13A shows the shaped sheet 1300 in perspective view, and FIG. 13B shows a cross-sectional view of the sheet 1300, viewed along line 13B-13B in FIG. 13A. The sheet includes protrusions 1302 and 1304 extending above a web portion 1305, with the protrusions 1304 each having a raised feature 1306. The protrusions 1302, 1304 may be removed from the shaped glass sheet 1300 (or simply "sheet 1300") to form button covers (or covers for other types of input devices). FIGS. 14A-16C illustrate example techniques for singulating the protrusions 1302, 1304

Figure 14A:
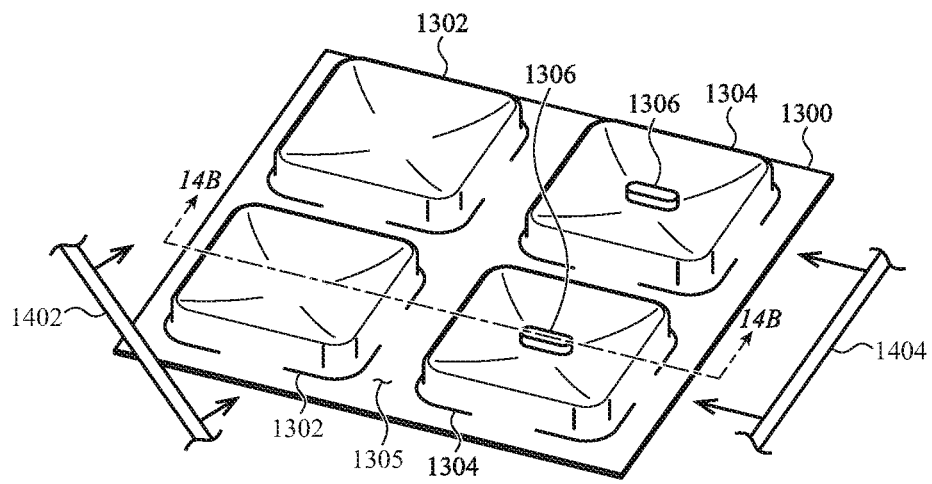
FIGS. 14A-14B show a shaped glass sheet at various stages of a singulation process.
Figure 14B:
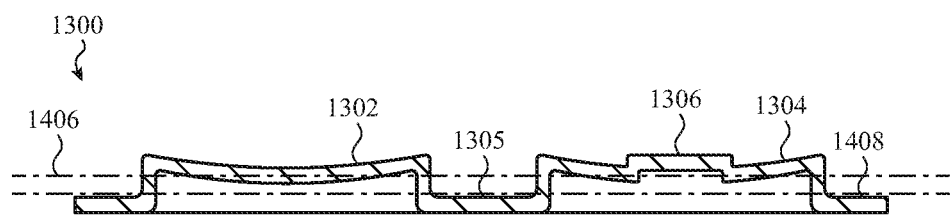

FIG. 14A shows the sheet 1300 being subjected to a singulating process in which the protrusions 1302, 1304 are removed with a wire saw (1402 or 1404). In particular, a wire saw, which may be a wire coated with an abrasive such as diamond particles, may be moved through the sheet 1300 in a direction that is substantially parallel to the plane of the sheet 1300. FIG. 14B, which shows a cross-section of FIG. 14A viewed along line 14B-14B in FIG. 14A, shows example paths 1406, 1408 of a wire saw through the sheet 1300. Each path 1406, 1408 may effectively singulate the protrusions 1302, 1304 from the web portion 1305. The path 1406 may remove some of the bottom of the protrusions 1302, 1304, while the path 1408 may not contact or traverse through the protrusions 1302, 1304, but instead cut through a joining portion 1410 that extends from the web portion 1305 to the main portion of the protrusions 1302, 1304.

Returning to FIG. 14A, a wire saw may be traversed through the material of the sheet 1300 along various possible directions. For example, a first wire saw 1404 is shown being moved perpendicularly to a straight or linear side of the protrusions 1302, 1304. As another example, a second wire saw 1402 is shown being moved at an angle relative to the straight side of the protrusions 1302, 1304. More particularly, the wire saw 1402 is moved so that it enters the sheet 1300 at a corner of one of the a protrusions 1302. Moving the wire saw 1402 in this direction may reduce the number of times that the wire saw 1402 must exit and re-enter the material of the sheet 1300 while singulating the protrusions of the sheet 1300. This may reduce stress on the cutting wire, the sheet 1300, and the individual protrusions being singulated, as the tension and shape of the wire may not vary as significantly throughout the cutting process as compared to a perpendicular cutting direction. This angled cutting technique may also reduce chipping, breakage, and other damage to the protrusions 1302, 1304 and the cutting wires.

Figure 15:
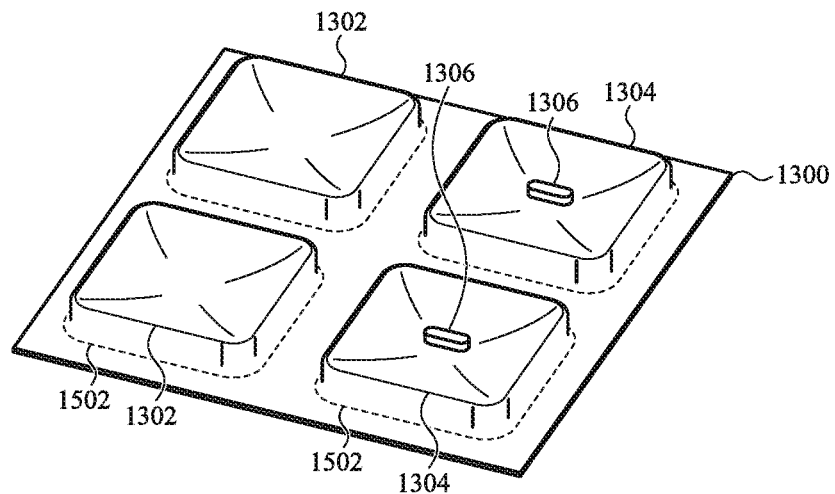
FIG. 15 shows a shaped glass sheet undergoing another singulation process.

FIG. 15 illustrates another singulating process for the sheet 1300. More particularly, FIG. 15 shows how the protrusions 1302, 1304 may be singulated by cutting around the protrusions along a direction that is substantially perpendicular to the plane defined by the sheet 1300. For example, a cutting tool (e.g., wire saw, milling bit, cutting wheel, scribe, etc.) or cutting beam (e.g., laser beam, plasma beam, etc.) may be directed onto the sheet 1300 and along the paths 1502 around the protrusions 1302, 1304 to singulate the protrusions from the sheet 1300.

Figure 16A:
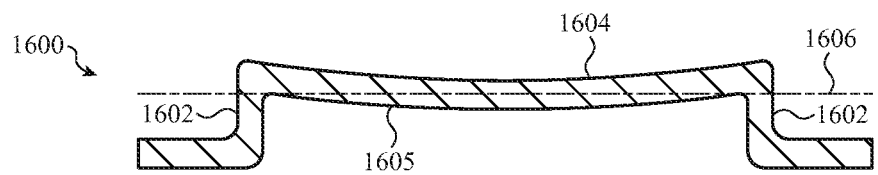
FIGS. 16A-16C show example post-processing steps for a button cover.
Figure 16B:
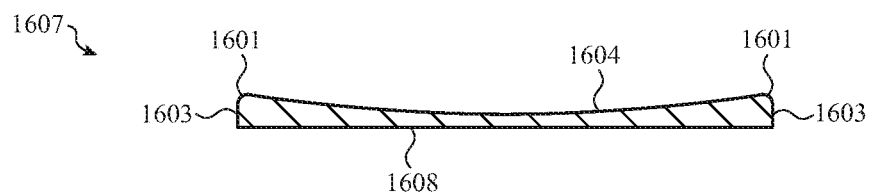
Figure 16C:
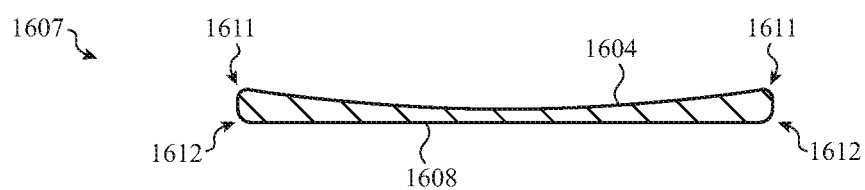

FIGS. 16A-16C illustrate the singulated protrusions at various stages of processing after singulation. FIG. 16A, for example, shows a cross section of a singulated protrusion 1600 (corresponding to the protrusion 1302, for example). The singulated protrusion 1600 defines a top surface 1604, a bottom surface 1605, and joining portions 1602 (corresponding to the joining portion 1410, FIG. 14). Where a singulating process removes the joining portions 1602, and optionally part of the bottom of the protrusion 1600, the singulated protrusion may instead resemble the button cover 1607 shown in FIG. 16B immediately after singulation. Also, as noted above, the top surface 1604 may correspond to the exterior or user-facing surface of a button cover, and may be a molded surface. In particular, the top surface 1604 may have a desired shape and surface texture or polish after molding and without machining, grinding, lapping, polishing, and/or other processing. In other cases, only a polishing step is required to produce a final surface finish on the top surface 1604. Similarly, the side surfaces 1603 (and the spline or edge 1601 where the top surface 1604 meets the side surfaces 1603) may have a desired shape, texture, or polish after molding and without further processing (e.g., without machining). Thus, the surfaces of the button cover 1607 that are or may be exposed to a user may be fully formed by the molding and/or slumping process. Moreover, because the top and side surfaces 1604, 1603 of the button cover 1607 are molded, they may not have sharp or defined apices at the edges where the top surface 1604 meets the side surfaces 1603. By contrast, where the top and side surfaces of glass button covers are formed or shaped by cutting, machining, and/or grinding the glass material, the button covers may have edges with sharp or well defined apices, which may be unattractive, prone to chipping, and may risk accidentally cutting or scraping users. In such cases, the edges (and optionally the top and side surfaces) may be dulled, machined, shaped, or otherwise dulled.

Returning to FIG. 16A, after singulation, the joining portions 1602 may need to be removed from the singulated protrusion 1600 (e.g., where the singulating operation does not fully remove the joining portions). Optionally, some of the bottom surface of the singulated protrusion 1600 may also be removed to produce the desired thickness and shape of the resulting button cover. Removing the joining portions 1602 and the portion of the bottom surface of the singulated protrusion 1600 (e.g., up to the line 1606) may be achieved by any suitable process, including lapping, machining, grinding, or the like. After removing the joining portions 1602 and forming the bottom surface, the singulated protrusion 1600 may be subjected to a polishing step in which the bottom surface is polished to produce a desired surface polish or texture. The polishing process may remove or mitigate scratches, cracks, or other damage caused by the removal of the joining portions 1602 and any optional grinding or lapping of the bottom surface of the singulated protrusion 1600.

After the joining portions 1602 are removed and the bottom surface is polished to a desired surface roughness, the singulated protrusion may resemble the button cover 1607 shown in FIG. 16B. The button cover 1607 defines a top surface 1604, which may be a user-facing surface having a shape that was defined by a mold surface or by the natural slumping of the glass material over the mold (as described above with respect to FIGS. 9-12, for example). As shown, the top surface 1604 defines a concave shape, which may provide a smooth, contoured, attractive interface surface to a button or other input device. The button cover 1607 also defines a bottom surface 1608, which may be substantially planar and suitable for coupling to a sub-structure of a button or other input device. As noted above, the bottom surface 1608 of the button cover may be a machined surface. For example, the bottom surface 1608 may be formed (and made substantially planar, or any other suitable shape) by any combination of wire cutting, lapping, polishing, machining, grinding, or the like. As noted above, a surface that is machined or ground (or otherwise subjected to a physical material removal operation) may have grooves, channels, cracks, ridges, or other patterns or features formed into the surface. These features or patterns may be substantially regular or repeating.

The button cover 1607 may have any suitable dimensions. For example, at the outer edges or outer region, the button cover 1607 may have a thickness between about 0.5 mm and about 1 mm, or between about 0.6 mm and about 0.75 mm. At the center or central region, the button cover 1607 may have a thickness between about 0.3 mm and about 0.6 mm, or between about 0.4 mm and about 0.55 mm. Of course, other thicknesses are also possible.

In some cases, the button cover 1607 may be subjected to further processing to change the shape of one or more of the edges. For example, the top edges 1611 and/or the bottom edges 1612 may be chamfered or rounded with additional machining or other material removal process(es). The chamfered or rounded edges may be less prone to chipping, cracking, or other damage than a raw edge. In some cases, only edges that are formed or affected by a machining or lapping process are chamfered or rounded. For example, as noted above, the top edges 1611 may be fully shaped by molding or slumping, without further post processing such as grinding or lapping, and thus may not form an edge with a sharp apex. On the other hand, a lapping or grinding process applied to the bottom of the button cover 1607 may result in an edge with a sharp apex. The rounding or chamfering may thus be applied to the bottom edges 1612 to remove or dull the apex.

FIGS. 17A-20C relate to another technique for forming glass covers for buttons or other input devices. In particular, FIGS. 17A-20C relate to a process in which grooves are formed in a glass sheet to define an array or group of protrusions, and a mold or press is applied to the protruding regions to impart a shape and optionally a texture to a top surface of the protrusions. The shape of the molding apparatus, and thus the shape of the top surfaces of the protrusions, may correspond to a target shape for a button cover, or a cover of any other suitable type of input device. After the shaping, the protrusions may be singulated from the sheet and further processed to remove excess material and ultimately produce final glass button covers.

Figure 17A:
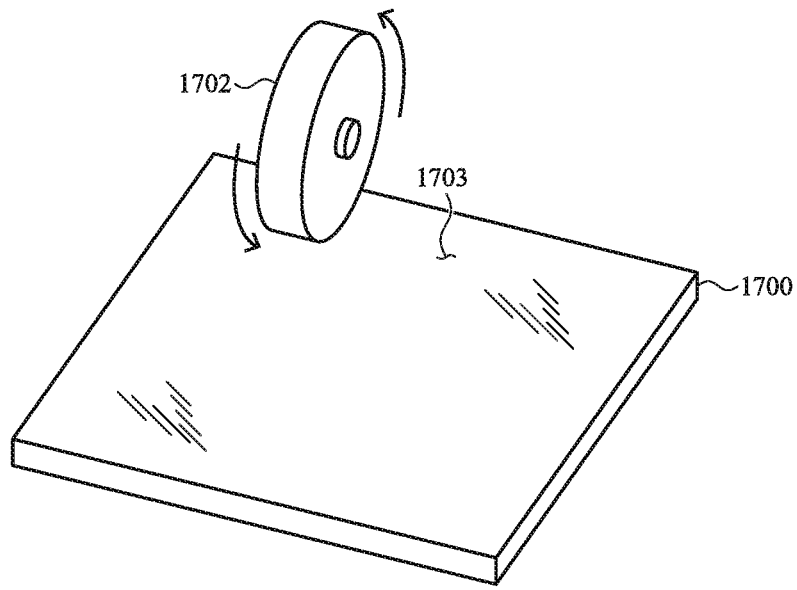
FIGS. 17A-17B show a glass sheet at various stages of a forming process.

FIG. 17A shows a glass sheet 1700 prior to having grooves formed therein. The glass sheet 1700 may be similar to any of the glass sheets described herein, and may be substantially planar and featureless. A grinding tool 1702 may be applied to the top surface 1703 of the glass sheet 1700 to form a pattern of grooves or recesses that define protrusions. The grinding tool 1702 is only shown as a grinding wheel for simplicity of illustration, and it instead may be any other suitable tool, such as an end mill, a wire saw, or the like. Other types of tools or processes may be used to form the grooves, such as laser etching, plasma etching, or the like.

Figure 17B:
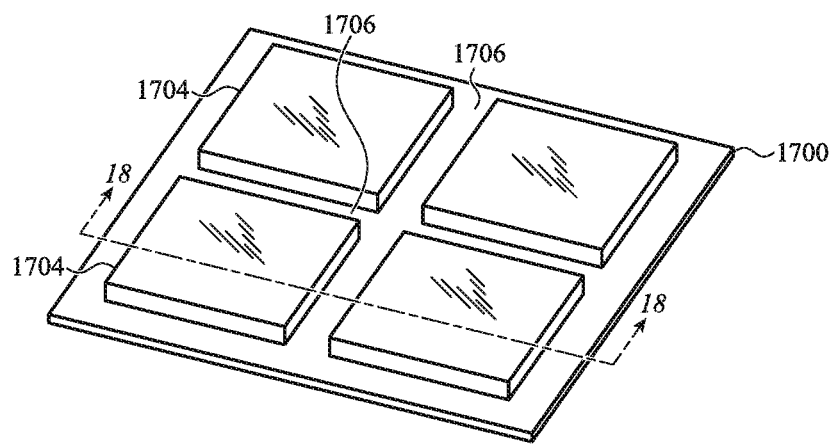

FIG. 17B shows the glass sheet 1700 after the grinding tool 1702 has formed grooves 1706 in the top surface 1703 of the glass sheet 1700. The grooves may define protrusions 1704, which may have a shape that substantially corresponds to the shape of the button covers that are to be formed from the glass sheet 1700. For example, as shown in FIG. 17B, the protrusions 1704 (and thus the button covers produced from the protrusions 1704) may be substantially square. More particularly, they may have a substantially square outer perimeter. Other shapes are also possible, such as circles, rectangles, or any other suitable shape.

Figure 18A:
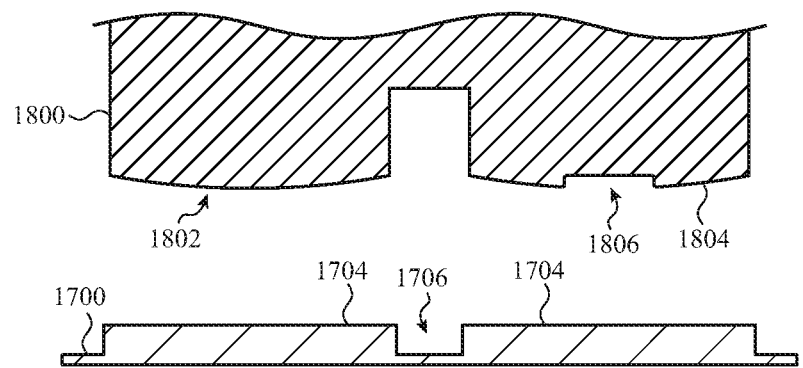
FIGS. 18A-18B shows a cross-sectional view of a pressing process to form a glass sheet.

FIG. 18A shows a cross-sectional view of the glass sheet 1700, viewed along line 18A-18A in FIG. 17B. The glass sheet 1700 may have any suitable thickness such as between about 1.0 mm and about 3.0 mm. As shown, the grooves 1706 extend only partly through the sheet 1700. The grooves 1706 may be any suitable depth, such as about 250 microns to about 1.0 mm, and the protrusions 1704 may have any suitable width, such as between about 250 microns to about 1.0 mm. Other dimensions are also possible. Because the protrusions 1704 are not formed by slumping or molding a glass sheet over a mold (as described above), the cross-section of the glass sheet 1700 after the grooves 1706 are formed may be different than that of a slumped or molded glass sheet. For example, the thickness of a shaped glass sheets that is molded or slumped (e.g., the shaped glass sheet 1300, FIG. 13A) may be substantially continuous or equal at different locations of the glass sheet, and the protrusions on one side of the molded or slumped sheet may have complementary recesses on the opposite side. By contrast, the protrusions in the glass sheet 1700 may not correspond to or be formed in part by recesses in the opposite surface, and the thickness of the sheet 1700 varies due to the machined or ground grooves 1706.

The grooves 1706 formed in the glass sheet 1700 may serve several functions. For example, the grooves 1706 may substantially define the shape of at least the top surfaces of the button covers that are to be formed from the glass sheet 1700. Further, as shown in FIGS. 18A-18B, the grooves may provide a relief area into which glass may flow or extend when a mold or press is applied to the top surfaces of the protrusions 1704 to impart a shape (e.g., a concave shape) to the protrusions and thus produce a desired shape for the user-facing surface of the button covers.

Figure 18B:
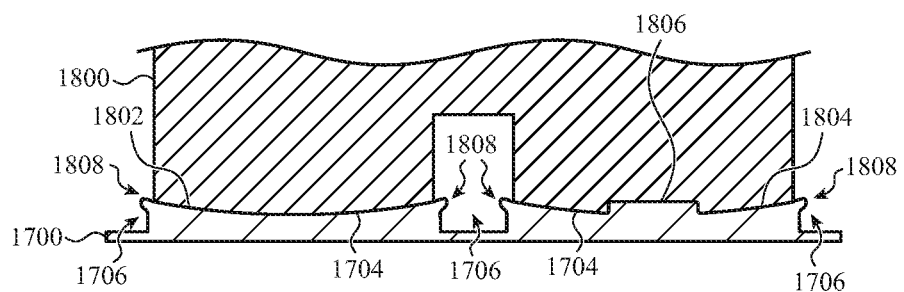

FIGS. 18A-18B illustrate an example process in which a press 1800 is applied to the top surfaces of the protrusions 1704 to impart a desired shape to the protrusions 1704. As noted above, one advantageous shape for a button cover is a concave shape that may feel comfortable when pressed by a user's finger. Accordingly, the press 1800 may have press surfaces 1802, 1804 with convex shapes that will, when pressed against the glass sheet 1700 (after the sheet is heated, for example), form complementary concave shapes in the top surfaces of the protrusions 1704. The press surfaces may also include other shapes, contours, or features that may form complementary features on the top surfaces of the protrusions 1704. For example, as noted above, raised features may be included on the surfaces of button covers to provide a tactilely perceptible feature that a user may easily detect with a finger. The press surface 1804 includes a recess 1806 that is configured to form a raised feature (e.g., the raised feature 121, FIG. 1) on the glass sheet 1700.

FIG. 18B shows the press 1800 in contact with the glass sheet 1700. The glass sheet 1700 may have been heated prior to the press 1800 being applied, such as in a furnace, with a flame, or using any other suitable technique. Alternatively, the glass sheet 1700 may be heated by the press 1800 itself as the press 1800 is applied to the glass sheet 1700. The press surfaces 1802, 1804 imprint a concave shape into the protrusions 1704, thus forming a top surface with a desired or target shape (and optionally forming the raised feature with the recess 1806). During the pressing or forming process, some of the glass of the protrusions 1704 may be forced outward, around the periphery of the protrusions 1704 and into the grooves 1706. For example, excess material 1808 may be forced outward due to the force from the press 1800. If the grooves 1706 were not present, the glass sheet 1700 may be deformed in a different way, which may make further processing inconvenient or difficult. For example, if a glass sheet without grooves were used, the force of the press 1800 may cause the glass to bubble or dome upwards in the regions between the presses, which may make singulation and further processing more difficult. Also, glass without the grooves 1706 may not take on and maintain the shape of the press surfaces 1802, 1804 as well as glass with the grooves 1706.

Figure 19:
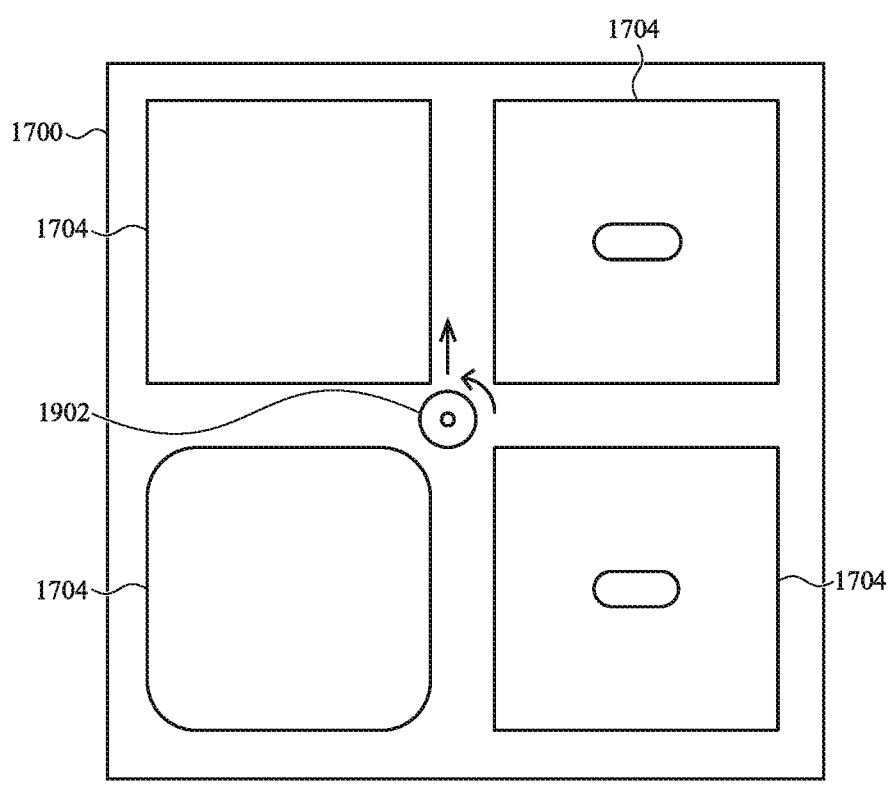
FIG. 19 shows a glass sheet undergoing a machining process.

In some cases, after the press 1800 imparts a desired shape to the protrusions of a glass sheet (e.g., the glass sheet 1700), the shaped protrusions may be further processed or shaped. For example, FIG. 19 shows the glass sheet 1700 undergoing a process in which the sides of the protrusions 1704 are machined or otherwise processed to round the corners of the protrusions. For example, a machining tool 1902 (e.g., an end mill) may be traversed along the corners and/or sides of the protrusions 1704 to round the corners of the protrusions 1704 (as shown on the protrusion 1704 in the lower left of FIG. 19).

The machining tool 1902 may extend to any suitable depth in the glass sheet 1700. For example, the machining tool 1902 may extend just to the bottom of the grooves 1706. In other examples, the machining tool 1902 may extend past the bottom of the grooves 1706, effectively forming deeper channels. In yet other examples, the machining tool 1902 may extend to a depth that is less than the depth of the channels. The depth to which the machining tool 1902 extends may depend at least in part on the target thickness for the button covers being produced from the glass sheet 1700. For example, the machining tool 1902 may extend to or only slightly beyond the depth that corresponds to a target thickness of the button covers.

In some cases, instead of or in addition to rounding the corners of the protrusions 1704, the machining tool 1902 removes all or some of the excess material 1808 formed during the pressing process. In such cases, the machining tool 1902 may be positioned so as to remove only the excess material 1808, leaving the grooves 1706 having substantially the same thickness (and substantially parallel and planar sidewalls) as the grooves 1706 after their initial formation. In other cases, the machining tool 1902 removes more material, leaving the grooves 1706 wider than their initial size, and reducing the overall dimensions of the protrusions 1704 (and thus producing smaller button covers).

Figure 20A:
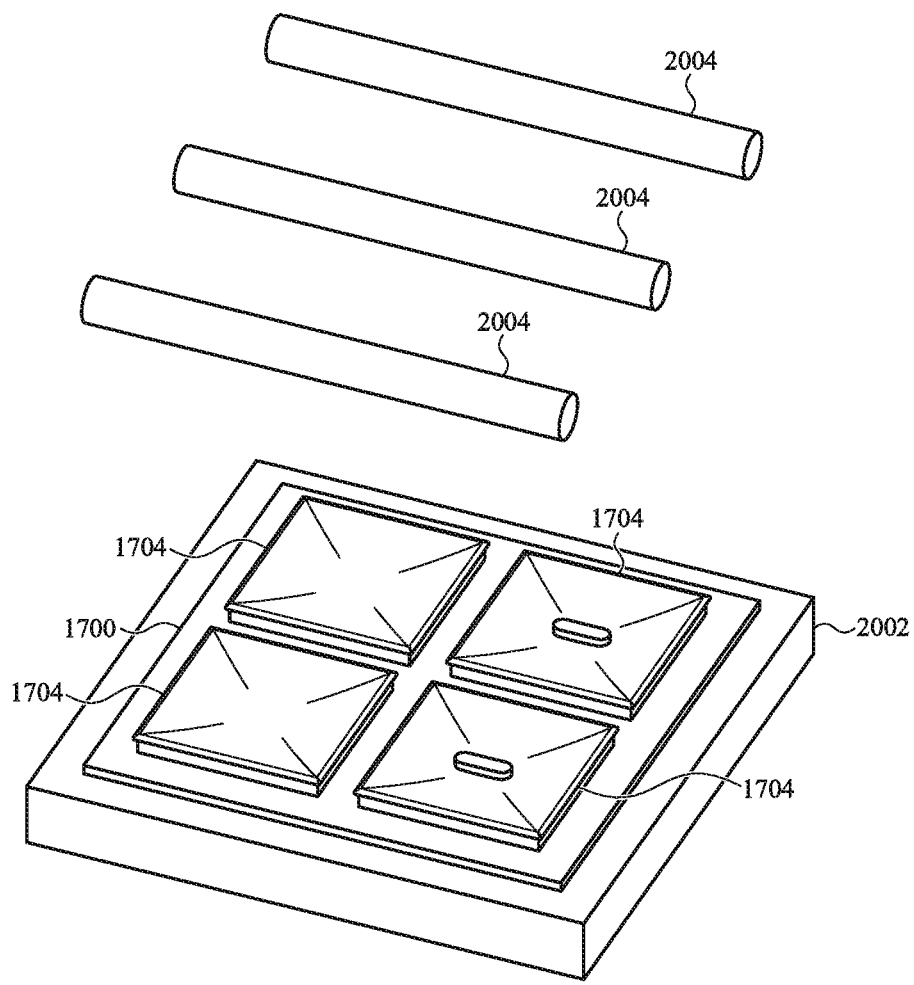
FIGS. 20A-20C show a glass sheet at various stages of a singulation process.
Figure 20B:
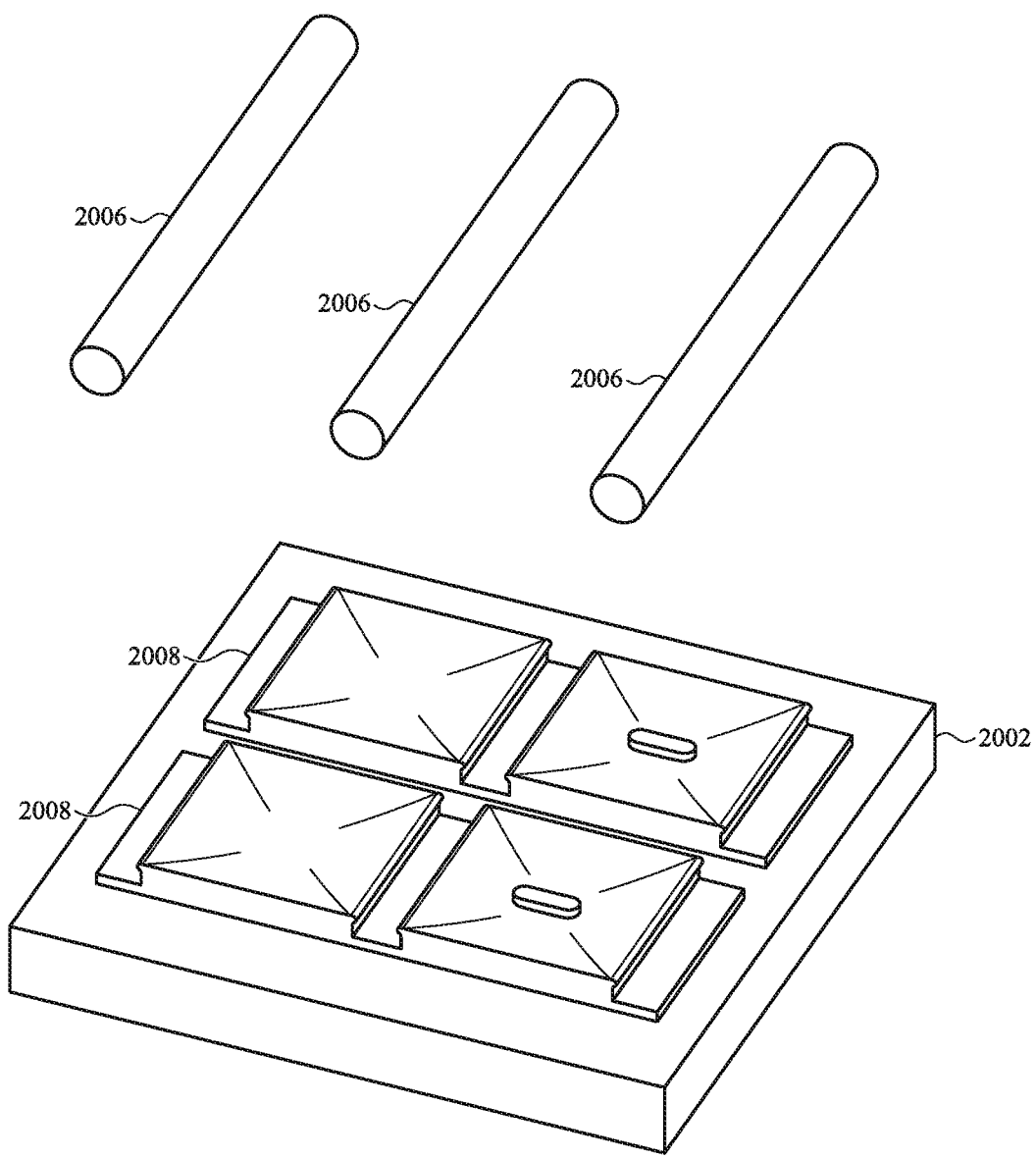
Figure 20C:
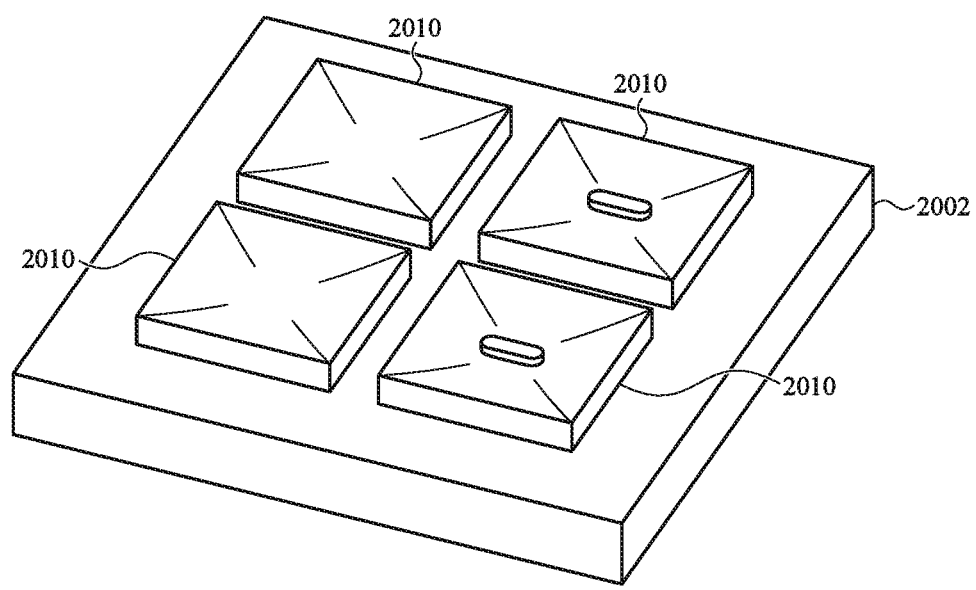

After the pressing operation (FIG. 18B), and optionally after further machining operations (FIG. 19), the button covers may be singulated from the glass sheet 1700. FIGS. 20A-20C illustrate an example singulation process for the glass sheet 1700. As shown in FIG. 20A, the glass sheet 1700 may be mounted to a support structure or fixture 2002 and positioned relative to wire saws 2004. The wire saws 2004 may be aligned with the grooves 1706, or otherwise positioned so that the wire saws 2004 form an edge or side of a button cover. That is, the wire saws 2004 may be configured to cut the button covers to their target peripheral dimensions. In some cases, a single wire is used along each groove, such that one side of a cutting wire cuts a side of one protrusion, and an opposite side of the cutting wire cuts a side of a second, adjacent protrusion. In other cases, multiple wires are used along each groove, with a first wire cutting a side of one protrusion, and a second wire cutting a side of a second, adjacent protrusion. Further, FIG. 20A shows a series of cutting wires 2004, such that multiple parallel cuts may be made in the glass sheet 1700 substantially simultaneously. In other cases, fewer wire saws 2004 may be used, and cuts may be made serially. Either or both of the wire saws 2004 and the fixture 2002 may be moved to bring the wire saws 2004 and the glass sheet 1700 into contact with one another, thus separating the glass sheet 1700 into at least two segments 2008.

FIG. 20B shows the glass sheet 1700 after cutting by the wire saws 2004 in FIG. 20A. In particular, the glass sheet 1700 has been separated into two segments 2008. As shown in FIG. 20B, an additional series of wire saws 2006 (which may be the same saws as shown in FIG. 20A, with either the fixture 2002 or the wires saws 2004 rotated ninety degrees) above the two segments 2008. The wire saws 2006 may be oriented substantially perpendicularly to the wire saws 2004 in FIG. 20A to produce substantially perpendicular cuts on the two segments 2008 of the glass sheet. As described above, either or both of the wire saws 2006 and the fixture 2002 may be moved to bring the wire saws 2006 and the glass sheet 1700 into contact with one another.

After the additional cutting process shown in FIG. 20B, the individual button covers may be formed. FIG. 20C shows the glass sheet after the cutting process in FIG. 20B, with four separated button covers 2010 still attached to the fixture 2002. The button covers 2010 may have exterior peripheral dimensions that are substantially equal to the target dimension. For example, additional machining or forming process may not be necessary, after the singulation steps in FIGS. 20A-20B, to produce the target peripheral size. In cases where further machining or processing is required to form the peripheral shape of the button covers, such processing may occur while the button covers 2010 are still attached to the fixture 2002. (The glass sheet 1700, and thus the button covers 2010, may be attached to the fixture in any suitable way, such as with adhesive, wax, cement, mechanical retention features, or the like.)

Figure 21A:
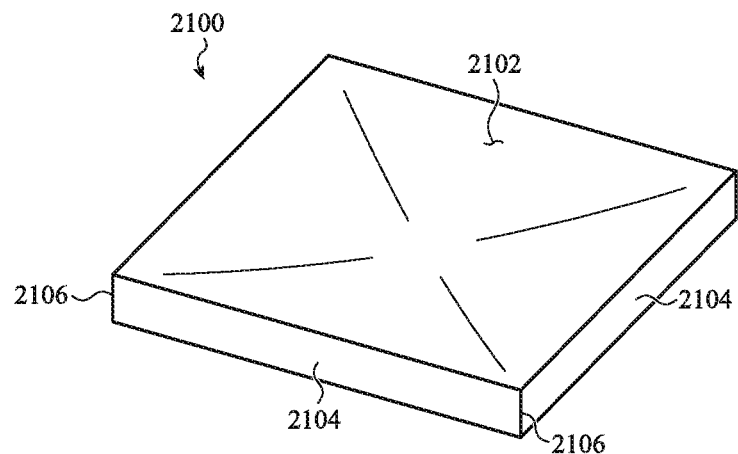
FIGS. 21A-21B show example button covers.
Figure 21B:
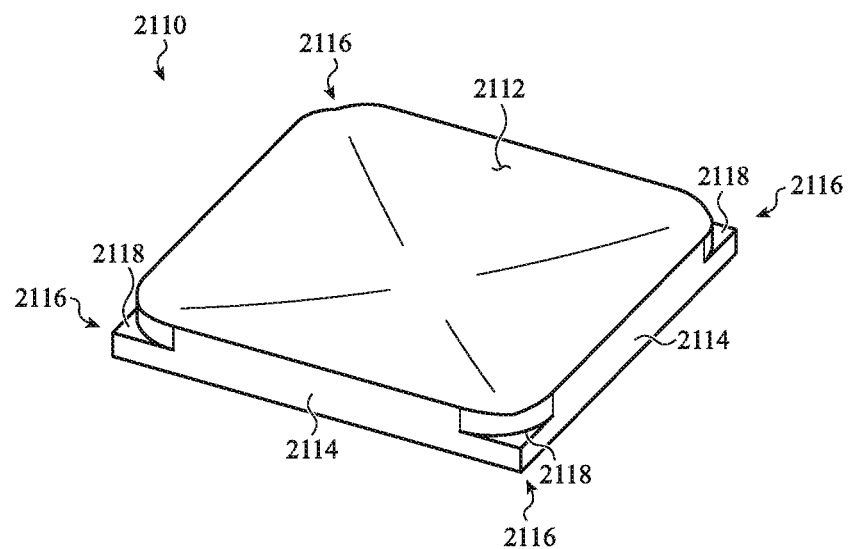

FIGS. 21A-21B show example button covers produced using the techniques described with respect to FIGS. 17A-20C, after singulation and optional post processing (e.g., polishing, machining, chamfering, lapping, etc.). FIG. 21A shows an example button cover 2100 having a contoured (e.g., concave) top surface 2102, formed at least in part by a press, such as the press 1800, FIG. 18A. The button cover 2100 may have substantially straight sides 2104 that join other sides at corners 2106 having defined apices (e.g., sharp corners). The sides 2104 and apices may be formed as a result of a singulation process. For example, where wire saws are used to singulate button covers from a sheet, as described with reference to FIGS. 20A-20C, the wire saws may produce sharp corners as a result of the cutting action of the wires. As noted above, further processing (e.g., polishing) may be performed on the sides 2104 and corners 2106 to slightly dull the edges formed by the cutting process, which may help reduce danger to user's fingers and also mitigate micro-cracks or other imperfections that may have been produced during cutting.

FIG. 21B shows another example button cover 2110 that may be produced using the techniques described with respect to FIGS. 17A-20C. In particular, FIG. 21B shows an example button cover 2110 having a contoured (e.g., concave) top surface 2112, formed at least in part by a press, such as the press 1800, FIG. 18A. The button cover 2110 may have sides 2114 that join other sides at corners 2116. While the button cover 2100 in FIG. 21A has sharp corners, a top portion of each of the corners 2116 in FIG. 21B has been rounded or contoured, such as with the machining process described with respect to FIG. 19. As shown, the rounded portion does not extend a full height of the corners 2116, but instead only extends only part way towards the bottom surface of the button cover 2110, thus forming ledges 2118 where the top portions of the corners 2116 (e.g., the rounded portions) meet the bottom portions of the corners 2116 (e.g., the portions that have sharp edges or well-defined apices). This configuration may result from a machining step (e.g., as described with respect to FIG. 19) in which the machining tool only rounds the corners to less than the complete thickness of the final button cover.

In some cases, the ledges 2118 may be used to help retain the button cover to an electronic device, and may provide an upstop that defines or sets the maximum travel of the button (or other input device). For example, if the button cover 2110 were used as the button cover 130 in FIG. 1, the ledges 2118 may be below the cover 110 and, and a biasing force (e.g., from a collapsible dome beneath the button cover 2110) may force the ledges 2118 into contact the bottom surface of the cover 110. In other cases, the button cover 2110 may be incorporated with an electronic device or input device such that the ledges 2118 are visible (e.g., they do not overlap with a bottom surface of a cover).

Figure 22:
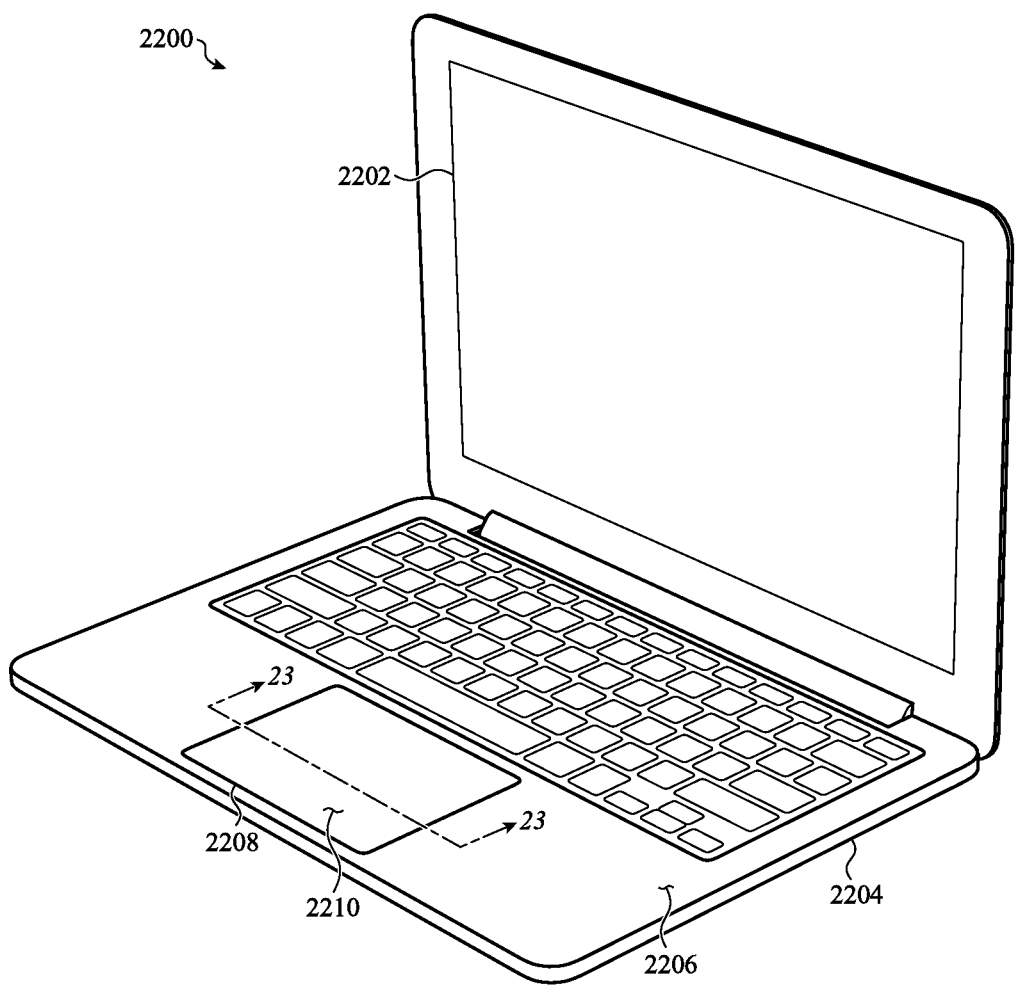
FIG. 22 shows another example electronic device.

FIGS. 3-21C refer generally to covers and/or button covers for a handheld electronic device, such as a smartphone. However, the processes and principles for forming those covers may also be used to make covers for other electronic devices or input devices. For example, FIG. 22 shows an example of another electronic device 2200 that may include a glass cover formed in accordance with the ideas described herein. In the illustrated embodiment, the electronic device 2200 is implemented as a laptop or notebook computer. The electronic device 2200 includes a housing 2204 and a display 2202 within and/or coupled to the housing 2204. The electronic device 2200 may also include a touch- and/or force-sensitive input device, such as a trackpad 2208, within and/or coupled to the housing 2204. The trackpad may be positioned in an opening in a top cover 2206. The top cover 2206 may be formed from or include any material, such as glass, metal, or the like. The top cover 2206 may also define a plurality of openings in which keys or keycaps may be disposed. The top cover 2206 may be formed in any suitable way, such as using the techniques described herein.

The trackpad 2208 may receive and/or detect inputs, such as touches, taps, gestures, and the like, and may include a cover 2210 that defines an exterior or interface surface of the trackpad 2208. The cover 2210 may be formed from or include a glass material, and may be formed in a manner similar to the covers described above (e.g., the cover 110 or the button cover 130).

Figure 23:
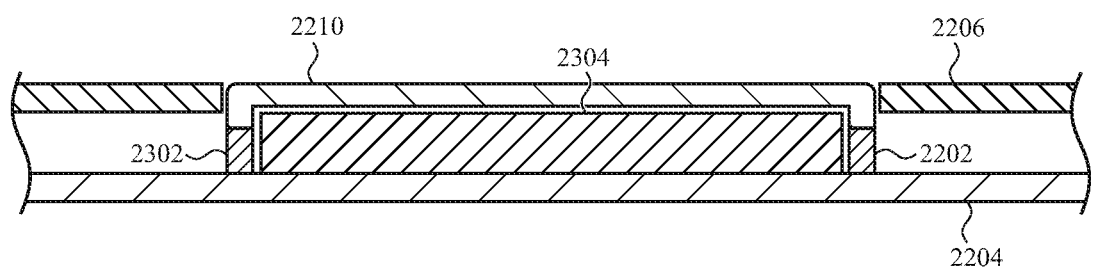
FIG. 23 shows a partial cross-sectional view of the electronic device of FIG. 22, viewed along line 23-23 in FIG. 22.

FIG. 23 shows a partial cross-sectional view of the electronic device 2200, and more particularly the trackpad 2208, viewed along line 23-23 in FIG. 22. The trackpad 2208 includes a touch sensor 2304 positioned below the cover 2210. The touch sensor 2304 may include various components for detecting touch inputs applied to the cover 2210. For example, the touch sensor 2304 may include capacitive sensing layers, resistive sensing layers, inductive sensing layers, filters, shields, dielectric layers, compliant layers (e.g., to allow the cover 2210 to move when a force input is applied), processors, and the like. The cover 2210 may be formed from or include any appropriate material that allows the touch sensor 2304 to sense objects applied to or near the cover 2210. For example, the cover 2210 may be glass, sapphire, a dielectric, or any other suitable material.

The trackpad 2208 may also include one or more force sensors 2302. In FIG. 23, the force sensors 2302 support the cover 2210 at an outer edge of the cover 2210, though this is merely one example configuration, and many other configurations are possible. For example, force sensors (or force sensing components) may be positioned below a central portion of the cover 2210, such as under, over, or integrated with the touch sensor 2304. The force sensors used in the trackpad 2208 (e.g., the force sensors 2302) may include components for any suitable force sensing system, such as piezoelectric sensors, strain gauges, capacitive force sensors, optical sensors, and the like.

Figure 24A:
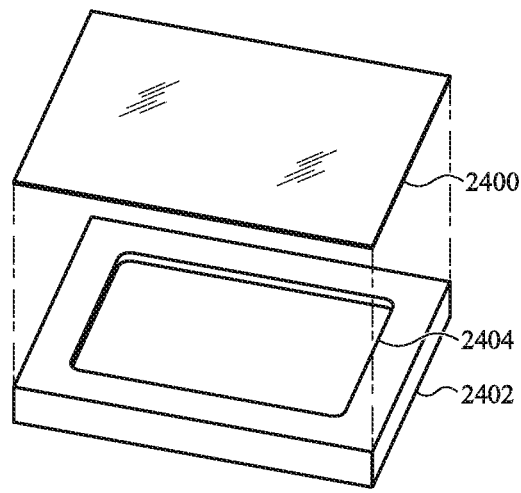
FIGS. 24A-24D show an example process for forming a cover for the electronic device of FIG. 22.
Figure 24B:
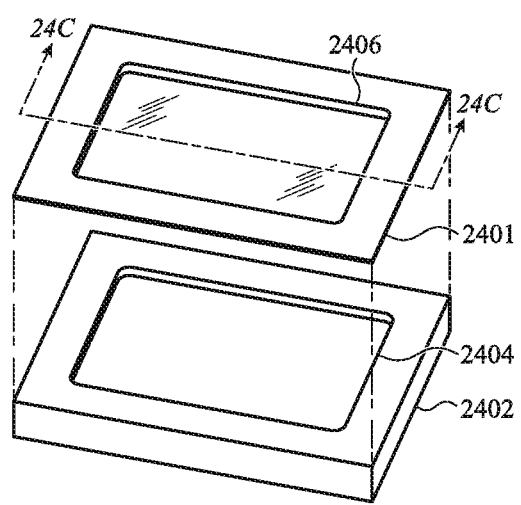

FIGS. 24A-24D illustrate an example process for forming a glass cover, such as the cover 2210. FIG. 24A shows a glass sheet 2400 positioned over a mold 2402. FIG. 24B shows a shaped glass sheet 2401 formed by molding (e.g., slumping) the glass sheet 2400 over the mold 2402. The mold 2402 defines a recess 2404, which produces a corresponding recess 2406 in the shaped glass sheet 2401.

FIG. 24B shows a cross section of the shaped glass sheet 2400 viewed along line 24C-24C in FIG. 24B. From the perspective of the bottom of the shaped glass sheet 2401, the recess 2406 defines a high relief portion 2408 and a low relief portion 2407. A joining segment 2410 joins the high relief portion 2408 (e.g., the recess) to a border or flange portion 2411.

FIG. 24B shows a cut line 2412 extending through the joining segment 2410, indicating where the shaped glass sheet 2401 is cut to singulate the high relief portion 2408 to be used as a cover for the trackpad 2208 (FIG. 22), or a different device. The high relief portion 2408 may be cut along the cut line 2412 using any appropriate tool or technique, such as a laser beam, electron beam, water jet, milling tool, or the like. As shown, the high relief portion 2408 is separated from the low relief portion 2407, and the low relief portion 2407 is not destroyed (e.g., it is simply cut away from the high relief portion 2408). In some cases, the low relief portion 2407 may be machined, ground, or otherwise removed from the high relief portion 2408 by a destructive process, leaving only the high relief portion 2408 (e.g., the recessed portion).

Figure 24C:
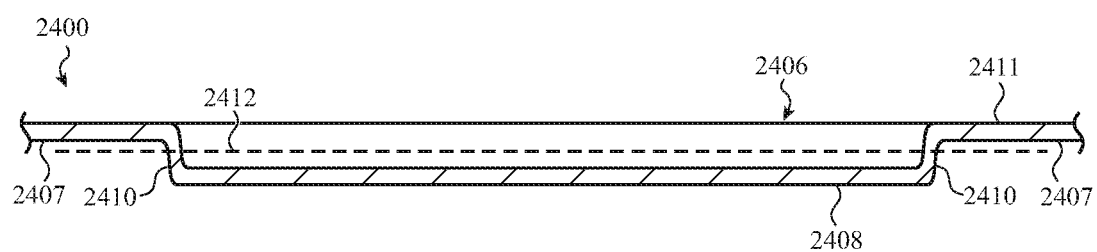
Figure 24D:
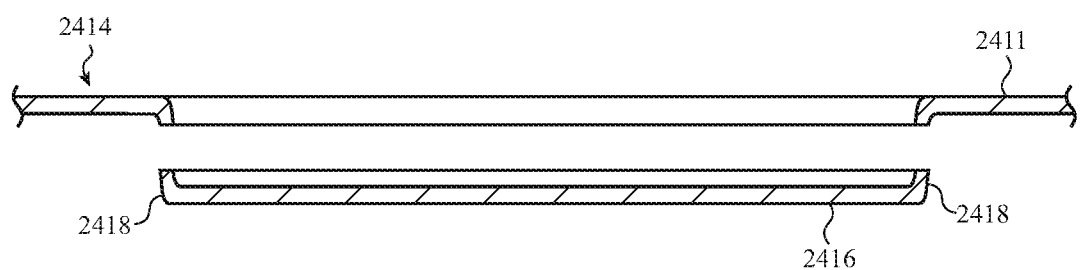

FIG. 24C shows a perforated glass sheet 2414 (corresponding to the low relief portion 2407) and a cover 2416 (corresponding to the high relief portion 2408), both formed from the shaped glass sheet 2401. The cover 2416 may be used as a cover for the trackpad 2208, or for any other electronic device or input device. The perforated glass sheet 2414 may be discarded or it may be used as a cover for an electronic device or input device. For example, the perforated glass sheet 2414 may be used as the top cover 2206 (FIG. 22), and the opening in the perforated glass sheet 2414 may frame or otherwise define an opening for the trackpad 2208 or another input device or mechanism.

The cut line 2412 may be positioned such that parts of the joining segments 2410 remain on the cover 2416 when the cover 2416 is singulated from the low relief portion 2407. This remaining material may form a wall 2418 around the outer perimeter of the cover 2416. The wall 2418 may be removed from the cover 2416 to form a substantially planar cover 2416, or it may be left on the cover 2416. Where the wall 2418 is left on the cover 2416, it may increase the stiffness of the cover 2416 by acting as a structural web element that reduces bending, flexing, or other deformations of the cover 2416 (e.g., by increasing the second moment of inertia of the cover 2416). Also, the wall 2418 may make the cover 2416 appear thicker than the actual thickness of the glass sheet. For example, even if the glass sheet is 0.5 mm thick, if the wall 2418 is 1.0 mm in length, the cover 2416 may appear to be 1.0 mm thick when viewed from the side or at an angle.

Figure 25:
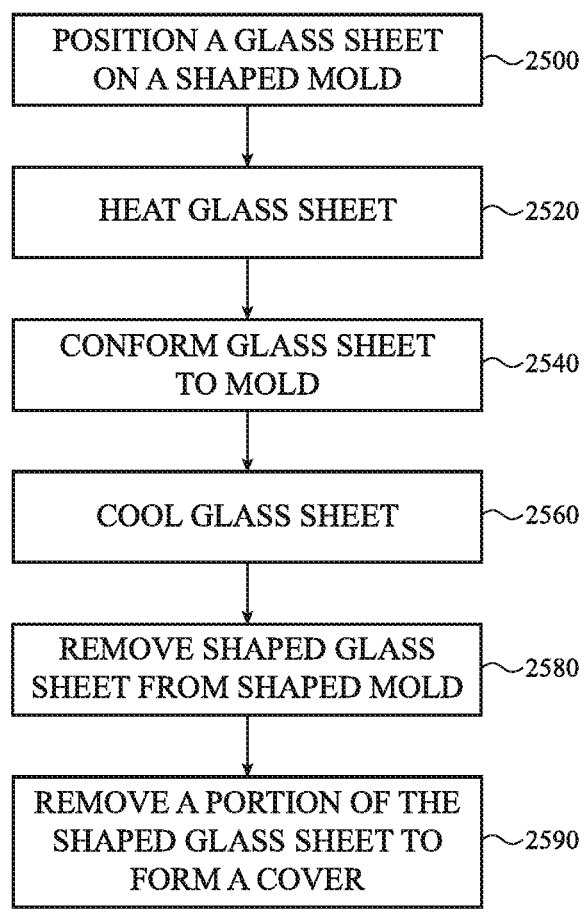
FIG. 25 shows an example process of forming a glass cover.

FIG. 25 shows an example process for forming a glass cover, such as the glass cover 110 or the button cover 130 of FIGS. 1-2, or the cover 2210 of FIG. 22. In operation 2500, a glass sheet (e.g., the glass sheet 300) is positioned on a shaped mold (e.g., the shaped mold 302) which defines at least one contour, recess, protrusion, or the like. For example, the glass sheet can be positioned over the shaped mold as illustrated in FIG. 3. The positioning can be performed by hand, as well as by robotic processes.

In operation 2520, the glass sheet is heated to a temperature that allows the glass to conform to the shape of the mold (e.g., a softening temperature). For example, the glass sheet may be heated to a glass transition temperature of the material of the glass sheet. The heating can take place in a furnace, an oven, kiln, electric melter, day tank, a pot furnace or any other unit that can be heated to the desired temperature, at the desired rate, for the requisite duration.

The heating can be accomplished by raising the temperature of the sheet (or the environment of the sheet) at a given rate to the softening temperature, and then holding the glass at that temperature for a given duration. The heating process may have multiple steps, such that the glass is heated to a first temperature and then maintained at the first temperature for a duration. Then, the glass may be heated to a second temperature and then held at the second temperature for a duration. The first and second temperatures, as well as the durations for which those temperatures are maintained, may be any suitable temperatures and durations.

In operation 2540, the glass sheet is conformed to a shape of the shaped mold. For example, once heated to the softening temperature, the glass sheet can be slumped over the shaped mold (e.g., forming the shaped glass sheet shown in FIG. 4). The glass sheet slumps over the features of the mold and adopts the contours of the shaped mold. A first shaped mold may have a first set of contours, and a second shaped mold may have a second set of contours. The contours may include recesses (e.g., the recesses 304, 306, FIG. 3) that are configured to form recesses relative to a substantially planar portion of the sheet, or protrusions (e.g., the protrusions 804, 806, FIG. 8A) that are configured to form protrusions relative to a substantially planar portion of the sheet. The contours may also include at least one indented portion (e.g., the recess 2404, FIG. 24) surrounded by a flange portion.

Optionally, in operation 2540, pressure may be applied to the glass sheet to assist the conforming process. Pressure may be applied to assist the conforming of the glass sheet. The pressure may be applied by contacting the heated glass sheet with a second shaped mold (e.g., an upper shaped mold). The upper shaped mold may have protrusions corresponding to a pattern that is complementary to the contours of the lower shaped mold (e.g., the shaped molds 302, 802, 2402). The second or upper shaped mold applies pressure to the heated glass sheet forcefully conforming the glass sheet to the contours (e.g., recesses and/or indentations) of the lower shaped mold. In another example, pressure may also be applied by applying a vacuum to the glass sheet in a vacuum chamber and/or through a vacuum mold. The vacuum may be applied through the shaped mold through lines or channels in the shaped mold providing assistance for the conforming of the glass sheet to the shaped mold. In this example, the glass sheet is drawn against the shaped mold.

In operation 2560, the glass sheet is cooled to form a shaped glass sheet. The cooling may be performed at any suitable cooling rate, and may be assisted, for example, by passing a cooling fluid (e.g., air, water) over the glass sheet.

The shaped glass sheet may have at least one indented (e.g., recessed) portion corresponding to a feature in the shaped mold. For example, the shaped glass sheet may have a recessed portion that corresponds to a location of a button or other input or output device, such as described with respect to in FIGS. 1-8B above. As another example, the shaped glass sheet may have at least one recessed portion and a flange portion surrounding the recessed portion, such as described with respect to FIGS. 22-24D above.

In operation 2580, the shaped glass sheet is removed from the shaped mold. The removal may be facilitated by the addition of a release agent, such as born nitride, on the shaped mold prior to heating the glass sheet. For example, removal of the shaped glass sheet from the shaped mold after cooling may be performed individually in a serial fashion, or using robotics to remove many shaped glass sheets in parallel.

In operation 2590, at least a portion of the of the high relief portion of the shaped glass sheet is removed to form a glass cover defining an opening or aperture for the electronic device. For example, an area of high relief may be removed by positioning the shaped glass sheet in a fixture and grinding a portion of the shaped glass sheet with a grinding machine, as shown in FIG. 6A, or otherwise machining it away. Removal may destroy the portion of the shaped glass sheet that is ground off by the grinding operation. By removing the high relief portion, the low relief portion may form a perforated sheet, and may be used as a cover glass on an electronic device such as a mobile phone, laptop computer, tablet computer, or other electronic device.

On the other hand, the removal may be accomplished by cutting the shaped glass sheet with a laser beam. For example, as shown in FIGS. 7A-7C, separation of a first portion (e.g., the low relief portion 414, FIG. 7A) and a second portion (e.g., the high relief portion 411, FIG. 7A) can be accomplished without destruction of either portion by cutting the shaped glass sheet with a laser beam or other suitable cutting technique. The laser beam may be directed on a joining portion (e.g., the joining portions 703, FIG. 7A) that joins the first portion (e.g., the low relief portion 414) and the second portion (e.g., the high relief portion 411) that is recessed or offset relative to the first portion. FIG. 7C illustrates the products of cutting a contoured glass sheet (e.g., a sheet having at least one recessed portion relative to a first portion), showing a cutting beam (e.g., laser beam) to form a perforated sheet corresponding to the first portion of the contoured glass sheet and a glass cover corresponding to the second portion of the contoured glass sheet.

While the present disclosure has been described with reference to various examples, it will be understood that these examples are illustrative and that the scope of the disclosure is not limited to them. Many variations, modifications, additions, and improvements are possible. More generally, examples in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. For example, while the methods or processes disclosed herein have been described and shown with reference to particular operations performed in a particular order, these operations may be combined, subdivided, or re-ordered to form equivalent methods or processes without departing from the teachings of the present disclosure. Moreover, structures, features, components, materials, steps, processes, or the like, that are described herein with respect to one embodiment may be omitted from that embodiment or incorporated into other embodiments.

What is claimed is:

1. A notebook computer, comprising:
a monolithic glass sheet defining:
   a substantially planar first sheet surface;
   a substantially planar second sheet surface opposite the first surface;
   an opening extending through the monolithic glass sheet; and
   a wall surrounding and extending from the opening; and
a key comprising:
   a glass key cover positioned at least partially within the opening and defining:
      a molded top surface having a concave shape and defining an exterior surface of the key; and
      a substantially planar machined bottom surface;
   a sub-structure coupled to the glass key cover; and
   a support mechanism movably supporting the sub-structure and the glass key cover relative to a base structure.

2. The notebook computer of claim 1, wherein:
the first sheet surface defines an exterior surface of the notebook computer; and
the wall extends a distance relative to the second sheet surface.

3. The notebook computer of claim 2, wherein the wall defines a top wall surface that is substantially parallel with the second sheet surface.

4. The notebook computer of claim 3, wherein:
the top wall surface is a machined surface; and
the wall has an unmachined exterior surface and an unmachined interior surface.

5. The notebook computer of claim 1, wherein:
the opening is a first opening;
the wall is a first wall; and
the monolithic glass sheet has a second opening and defines a second wall surrounding and extending from the second opening.

6. The notebook computer of claim 5, wherein the first and second walls extend substantially the same height above the second surface.

7. A notebook computer, comprising:
a display portion; and
a housing portion flexibly coupled to the display portion by a hinge, the housing portion comprising:
   a base structure;
   a cover coupled to the base structure and defining a keyboard region having a plurality of apertures; and
   a key in the keyboard region and comprising:
      a glass key cover positioned at least partially within an aperture of the plurality of apertures and defining:
         a molded top surface having a concave shape and defining an exterior surface of the key; and
         a substantially planar machined bottom surface;
      a sub-structure coupled to the glass key cover; and
      a support mechanism movably supporting the sub-structure and the glass key cover relative to the base structure.

8. The notebook computer of claim 7, wherein:
the glass key cover further comprises a raised feature extending from the molded top surface.

9. The notebook computer of claim 7, wherein:
a thickness at a central region of the glass key cover is between about 0.3 mm and about 0.5 mm; and a thickness at an outer region of the glass key cover is between about 0.6 mm to about 0.75 mm.

10. The notebook computer of claim 7, wherein the glass key cover is coupled to the sub-structure with adhesive.

11. The notebook computer of claim 7, wherein the glass key cover has a substantially square outer perimeter.

12. The notebook computer of claim 7, wherein the input device comprises a collapsible dome below the sub-structure, the collapsible dome biasing the sub-structure and glass key cover towards a biased position.

13. The notebook computer of claim 12, wherein the sub-structure is configured to contact the collapsible dome to collapse the collapsible dome in response to a user input.

14. The notebook computer of claim 7, wherein the cover is formed of glass.

\* \* \* \* \*